United States Patent
Rebel et al.

(10) Patent No.: US 8,729,976 B2
(45) Date of Patent: May 20, 2014

(54) METHODS AND APPARATUS FOR CALIBRATION AND TEMPERATURE COMPENSATION OF OSCILLATORS HAVING MECHANICAL RESONATORS

(75) Inventors: Reimund Rebel, Maricopa, AZ (US);
Jan H. Kuypers, Cambridge, MA (US);
David Locascio, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 13/182,008

(22) Filed: Jul. 13, 2011

(65) Prior Publication Data
US 2012/0013410 A1    Jan. 19, 2012

Related U.S. Application Data

(60) Provisional application No. 61/363,759, filed on Jul. 13, 2010.

(51) Int. Cl.
*H03L 1/00* (2006.01)

(52) U.S. Cl.
USPC ............. 331/176; 331/154; 331/158; 331/16; 331/34

(58) Field of Classification Search
USPC .................... 331/176, 158, 116 R, 116 FE
See application file for complete search history.

(56) References Cited

U.S. PATENT DOCUMENTS

| | | | |
|---|---|---|---|
| 5,583,501 A | 12/1996 | Henrion et al. | |
| 6,420,938 B1 | 7/2002 | Hoff et al. | |
| 6,784,817 B2 | 8/2004 | Matsuura et al. | |
| 6,933,788 B2 * | 8/2005 | Forrester | 331/1 R |
| 7,205,858 B2 * | 4/2007 | Kato | 331/158 |
| 7,573,345 B2 * | 8/2009 | Hardy et al. | 331/158 |
| 2008/0117722 A1 | 5/2008 | Ahuja et al. | |
| 2008/0297268 A1 | 12/2008 | Matsui et al. | |
| 2010/0182102 A1 | 7/2010 | Chen et al. | |

OTHER PUBLICATIONS

International Search Report from PCT/US2011/043842, mailed Oct. 31, 2011.

* cited by examiner

*Primary Examiner* — Arnold Kinkead
(74) *Attorney, Agent, or Firm* — Wolf, Greenfield & Sacks, P.C.

(57) ABSTRACT

Methods and apparatus for calibration and temperature compensation of oscillators having mechanical resonators are described. The method(s) may involve measuring the frequency of the oscillator at multiple discrete temperatures and adjusting compensation circuitry of the oscillator at the various temperatures. The compensation circuitry may include multiple programmable elements which may independently adjust the frequency behavior of the oscillator at a respective temperature. Thus, adjustment of the frequency behavior of the oscillator at one temperature may not alter the frequency behavior at a second temperature.

6 Claims, 24 Drawing Sheets

Prior art

METHODS AND APPARATUS FOR CALIBRATION AND TEMPERATURE COMPENSATION OF OSCILLATORS HAVING MECHANICAL RESONATORS

RELATED APPLICATIONS

The present application claims the benefit under 35 U.S.C. §119(e) of U.S. Provisional Patent Application No. 61/363,759, filed on Jul. 13, 2010, entitled "Methods and Apparatus for Calibration and Temperature Compensation of Oscillators Having Mechanical Resonators", which is hereby incorporated herein by reference in its entirety.

BACKGROUND

1. Field

The technology described herein relates to temperature calibration and temperature compensation of oscillators having mechanical resonators.

2. Related Art

Oscillators are ubiquitous components in electronic equipment including wireless and wireline communications systems, entertainment electronics, aerospace systems, and timing systems. The oscillators traditionally are used to provide a reference signal or clock signal, such that precision of the signal frequency is important. Conventionally, crystal oscillators having quartz crystals as the resonating element have served as the oscillators of choice because they can be manufactured to provide precise signal frequencies within ±1.5 parts-per-million (ppm) of a target frequency value, frequency stabilities of ±2.5 ppm over the entire operating temperature range from −40° C. to +85° C., tunability of up to ±15 ppm, aging of below ±1 ppm/year (at 25° C.), typical phase noise of −138 dBc/Hz at 1 kHz, and power consumption as low as 1.5 mA.

Different categories of crystal oscillators have developed, including crystal oscillators (XO), temperature compensated crystal oscillators (TCXO), and oven-controlled crystal oscillators (OCXO). The TCXO is very similar to the XO, except that the compensation uses a temperature sensor and a tuning circuit that allows the frequency of the quartz crystal resonator to be corrected depending on the temperature. As a result the temperature stability of a typical XO of about ±10 ppm can be reduced down to ±1.5 ppm or even ±0.5 ppm.

SUMMARY

According to a first aspect, a method of calibrating temperature compensation circuitry of an oscillator is provided, the oscillator comprising a mechanical resonator coupled to the temperature compensation circuitry. The method comprises setting a first temperature of the oscillator and adjusting a first component of the temperature compensation circuitry to set an output frequency of the oscillator to a desired value at the first temperature. The method further comprises setting a second temperature of the oscillator and adjusting a second component of the temperature compensation circuitry to set the output frequency of the oscillator to the desired value at the second temperature.

According to another aspect, a temperature compensation circuit configured to form part of an oscillator comprising a mechanical resonator is provided. The temperature compensation circuit comprises at least first and second adjustable circuit components configured to independently alter an output frequency of the oscillator.

BRIEF DESCRIPTION OF THE DRAWINGS

Various aspects and embodiments of the technology will be described with reference to the following figures. It should be appreciated that the figures are not necessarily drawn to scale. Items appearing in multiple of the figures are indicated by the same or similar reference number in all the figures in which they appear.

DETAILED DESCRIPTION

Aspects of the technology are directed to calibration and temperature compensation of oscillators having mechanical resonators. According to one aspect, calibration of oscillator temperature compensation circuitry involves setting values of independently programmable components of the temperature compensation circuitry to cause a desired oscillator frequency response at each of only a small number of discrete temperatures (e.g., less than ten, less than five, etc., but at least three). Accurate temperature compensation over the entire operating temperature range of the oscillator may still be provided, without the need to perform a temperature sweep or any confirmation temperature measurements.

According to one aspect of the technology, oscillator temperature compensation circuitry includes at least three independently controllable/programmable components each configured to set the frequency response of the oscillator at a respective temperature. Setting each of the components suitably to provide a desired oscillator frequency response at a respective temperature may provide accurate temperature compensation of the oscillator over the entire operating temperature range (e.g., from −40° C. to +85° C. or any other suitable operating temperature range). According to some embodiments, the controllable/programmable components are digital-to-analog converters (DACs).

The aspects described above, as well as additional aspects, are described further below. These aspects may be used individually, all together, or in any combination of two or more, as the technology is not limited in this respect.

Figure 1:
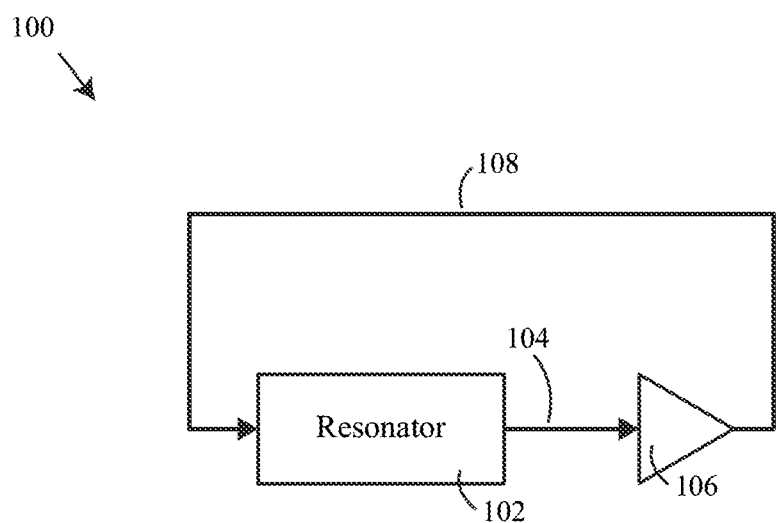
FIG. 1 is a block diagram of an oscillator using a mechanical resonator.

A basic oscillator using a mechanical resonator is shown in FIG. 1. It comprises a closed loop comprising a resonator 102 producing an output signal 104 and an amplifier 106 producing a feedback signal 108. For this system to operate as an oscillator and sustain steady-state oscillation it must fulfill the Barkhausen stability criteria, requiring that the loop gain equal unity and the phase around the loop is an integer multiple of 360°, including 0°, and negative integers.

In the most simple case the amplifier will have a phase delay equivalent to 0° phase shift and the mechanical resonator will show a phase shift of 0° at the resonance frequency of the mechanical resonator. As a result the oscillator will oscillate at the resonance frequency defined by the resonance frequency of the resonator. In some cases an inverting amplifier is used that introduces a phase change of −180°. As a result, a phase shift of ±180° or any odd multiple of 180° has to be added to the oscillator loop for the oscillator to oscillate at a frequency close to or identical to the resonance frequency of the resonator.

It should be understood that for a practical oscillator the phase shift introduced by the amplifier will range between 0° and as much as ±45°. The resonator might operate at a frequency related to a phase shift that will be close to 0°, but might be as much as ±45°. However, the applicability of the various aspects described herein is not limited by the amount of phase delay introduced by any of the components of the oscillator.

Figure 2:
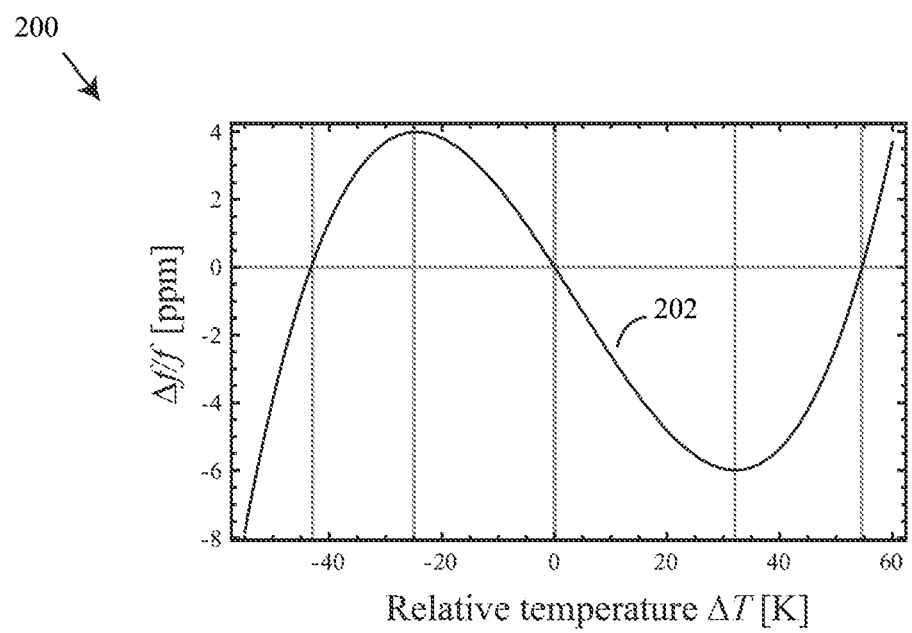
FIG. 2 is a graph of the relative frequency error of an oscillator using an AT-cut quartz crystal.

The resonance frequency of oscillators including mechanical resonators is temperature dependent. The resonance frequency of the mechanical resonator defines the oscillation frequency of the oscillator. The resonance frequency of any mechanical resonator is a function of the operating temperature, and in particular the temperature dependence of the stiffness coefficients, density, thermal expansion and temperature related induced stresses of components of the mechanical resonator. As mentioned previously, quartz crystals have been used conventionally as the resonators of choice in oscillators. The relative frequency deviation of the resonance frequency for a conventional AT-cut quartz crystal resonator is shown in FIG. 2. The relative frequency deviation over the entire temperature range illustrated is in this case less than ±8 ppm. Although the circuit components of an oscillator may additionally contribute to temperature-dependent frequency behavior, it can be assumed in appropriate circumstances that the dominant temperature-dependent frequency behavior of an oscillator arises from the mechanical resonator. Thus, an oscillator including the mechanical resonator operating as shown in FIG. 2 will show substantially the same temperature-dependent behavior.

Figure 3:
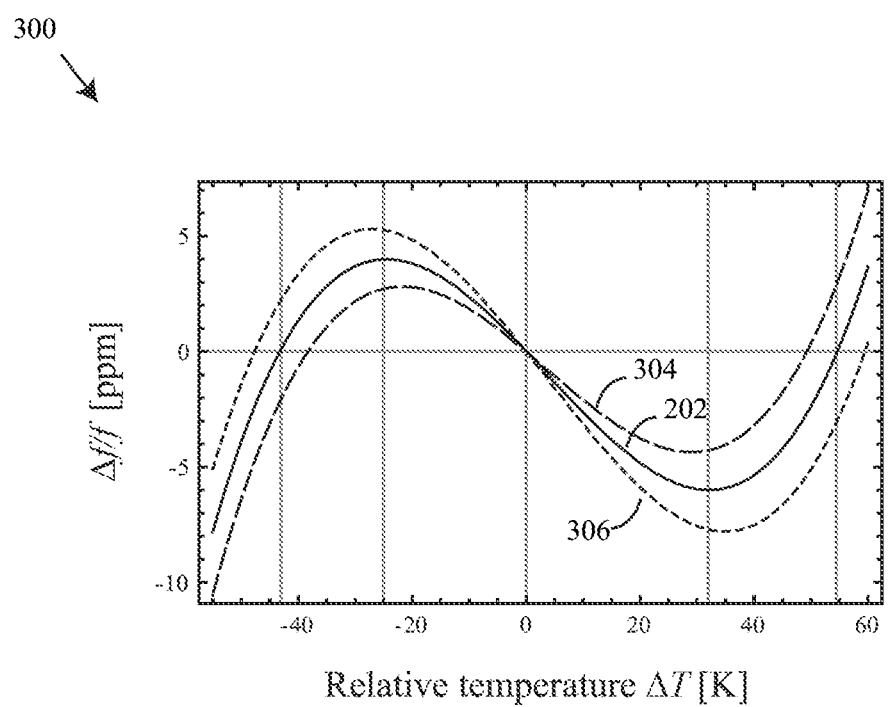
FIG. 3 illustrates the effect of cut-angle inaccuracy on the relative frequency error of an oscillator using an AT-cut quartz crystal.

The frequency response illustrated in FIG. 2 assumes a particular cut angle for the AT-cut quartz crystal. However, altering the cut angle of the quartz crystal alters the temperature dependent behavior of the crystal, and thus the temperature dependent frequency behavior of an oscillator including the quartz crystal. FIG. 3 illustrates alternative frequency response curves 304 and 306 of a conventional quartz resonator for two additional cut angles of the quartz crystal.

Figure 4:
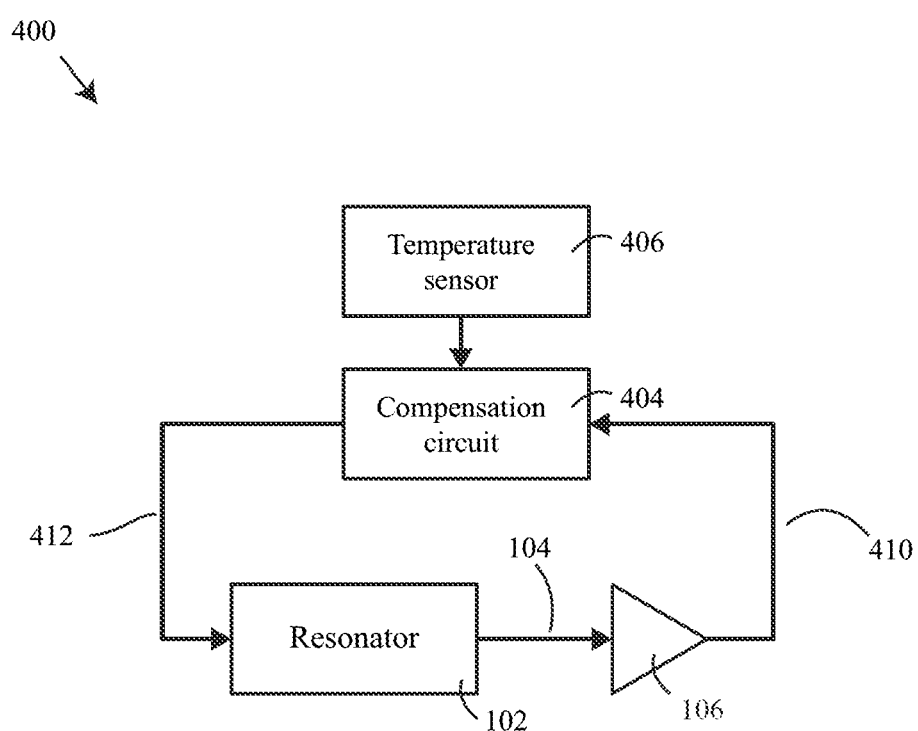
FIG. 4 is a block diagram of an oscillator with temperature compensation.

The temperature stability of oscillators using quartz AT-cut resonators is generally in the range of ±10 ppm over a temperature operating range from −40° C. to +85° C. For many applications this frequency stability is not sufficient. Numerous applications require frequency stabilities better than ±2.5 ppm or even ±0.5 ppm. To achieve better frequency stability of the crystal oscillator (XO), a temperature compensation circuit is added to the oscillator circuit. A block diagram of such a device 400 is shown in FIG. 4. The temperature compensation circuit 404 receives signal 410 and employs a tuning method that either induces a frequency shift of the resonator or of the circuit, or both. It should be understood that many techniques are feasible. For the compensation circuit 404 to apply a suitable temperature dependent compensating signal 412 it requires information of the exact temperature of the resonator, which it receives from the connected temperature sensor 406.

The achievable temperature accuracy of the temperature compensated oscillator shown in FIG. 4 depends on how deviations of the mechanical resonator, the temperature sensor, the compensation circuit, the circuit components of the oscillator, parasitics, and effects regarding the tuning method employed by the compensation circuitry can be controlled or accounted for by the compensation circuit. The compensation circuit comprises different adjustable parameters to account for these variations. The actual adjustment of the compensation circuit is performed during a calibration sequence. This assumes though that all contributions are stable with time, i.e. that there is no aging or hysteresis. In reality, there may be variations over time, but that is a separate issue addressed separately from initial calibration of the temperature compensation circuitry.

Figure 5A:
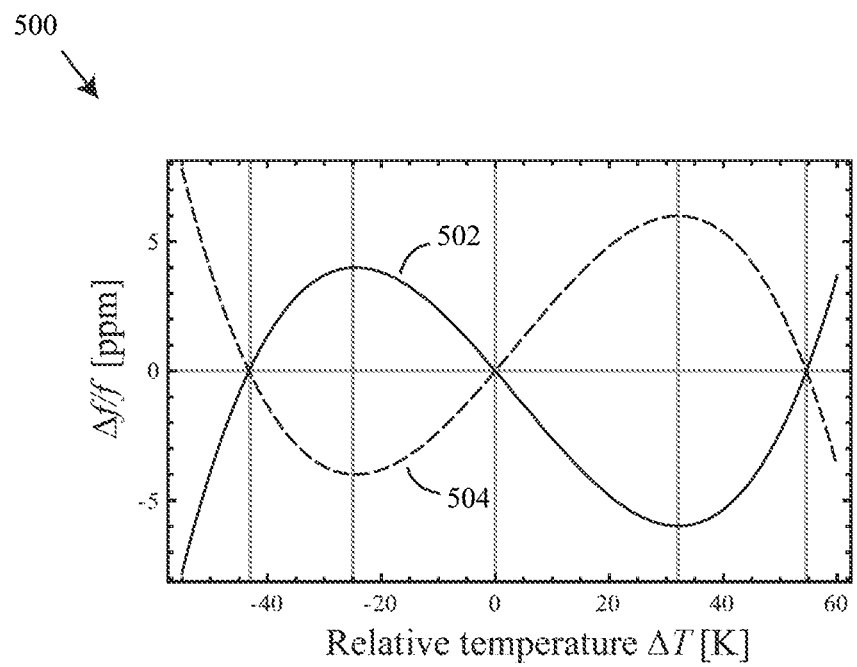
FIG. 5A illustrates the relative frequency error of an oscillator using an AT-cut quartz crystal and the required tuning signal.

As mentioned previously, conventional oscillators with resonators utilize quartz crystals as the resonators. Thus, calibration of temperature control circuitry has evolved on the basis that quartz crystals are being used. One solution to compute the temperature dependent tuning signal for the oscillator is to use a microcontroller with memory as the compensation circuit. Referring to plot 500 of FIG. 5A, during the calibration the frequency deviation (i.e., temperature dependent frequency response) 502 of the oscillator is measured by sweeping through the entire operating temperature range and then the tuning values that would be required to produce the complementary response 504 are stored in the memory. Thus, by applying those tuning values during operation of the oscillator, the frequency response is temperature compensated. Such oscillators are often referred to as Microcomputer Compensated Crystal oscillators (MCXO). They have the inherent drawbacks that they require more power, larger die area and cause frequency discontinuities in the oscillator output.

The most popular high stability crystal oscillators use a compensation circuit and not a microcontroller, due to the miniature size, cost and stability of the compensation circuit. However, it is difficult for a circuit to imitate the temperature dependency of a mechanical resonator. To see this, plot 550 of FIG. 5B separates the frequency response 502 of FIG. 5A into the various contributions, including first order 552, second order 554 and third order 556 dependencies. These different temperature dependencies can be related to the temperature dependencies of the resonator material, the electrode materials, stress effects, mounting, and the circuit components of the oscillator. As seen, the linear component 552 is large, as well as the third order component 556. It is difficult for a circuit to reproduce these different contributions and the resulting characteristics of the frequency response 502.

Figure 6A:
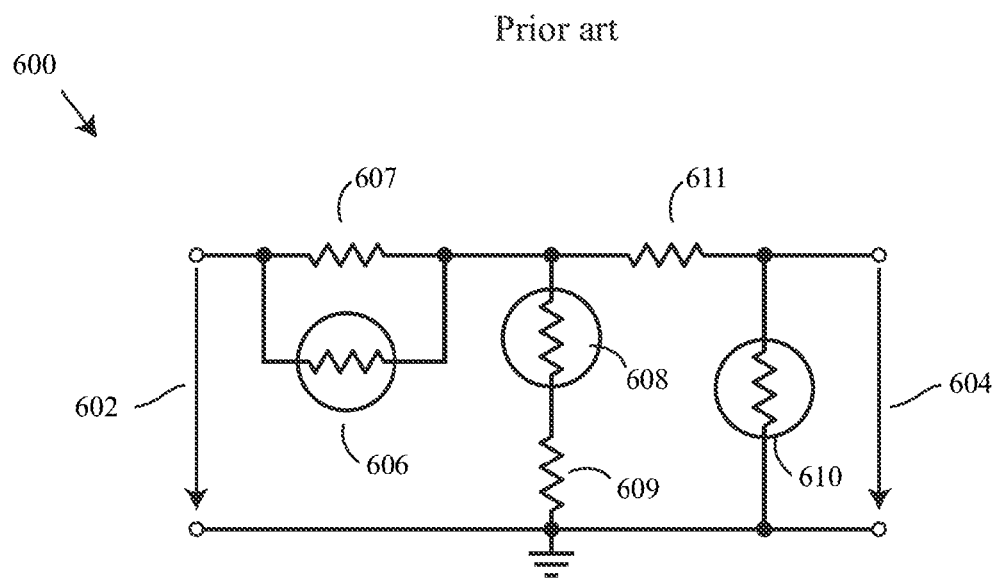
FIG. 6A illustrates a thermistor based network for temperature compensation according to the prior art.
Figure 6B:
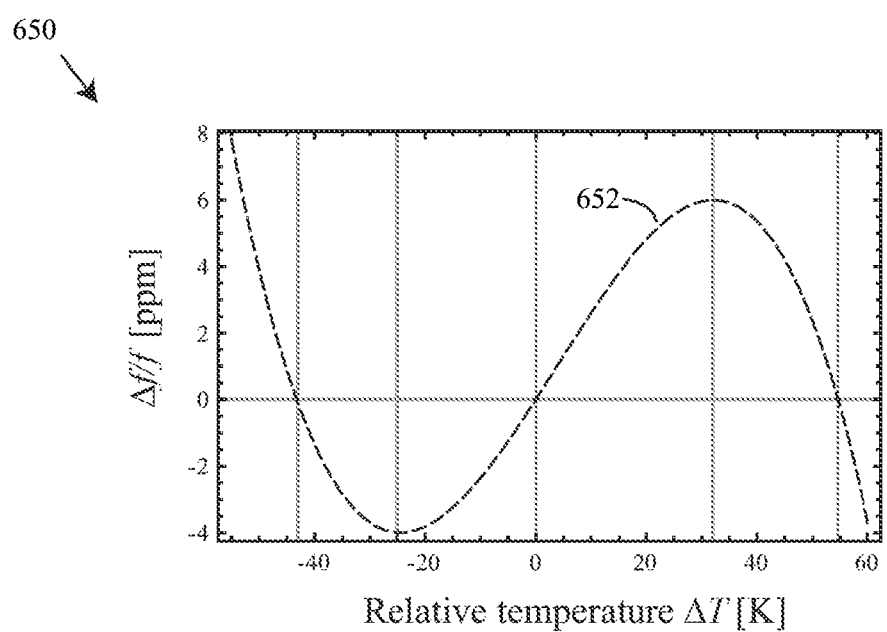
FIG. 6B illustrates the output signal of the prior art thermistor based network of FIG. 6A.

A conventional circuit 600 used as a temperature compensation circuit for AT-cut quartz resonators is shown in FIG. 6A. It assumes a supply voltage to be applied at the input 602 and the output signal 604, representing a tuning signal, is shown in FIG. 6B (as 652 in plot 650). In this case the compensation circuit is not connected to one temperature sensor, but rather uses three temperature dependent resistors (606, 608, 610), also referred to as thermistors. The resistors 607, 609 and 611 are adjusted to compensate the temperature characteristics of AT-cut crystals. The drawbacks of this technology are that the resistors have to be trimmed and that the output signal is a function of all resistors to be trimmed, i.e., they do not operate independently. That means, although resistor 607 mainly influences the temperature characteristics at very low temperatures it does affect the characteristics at room temperature and high temperatures. The resistor 609 is mainly for adjusting the characteristics at room temperature, but nevertheless influences the tuning signal significantly at high temperatures. This means that, after extracting the relative frequency error over temperature for a particular resonator, a sophisticated algorithm is required to compute a set of resistor values (607, 609, 611) for the particular resonator. It also means that errors due to the limited accuracy of the trimming will affect the temperature compensation behavior over the entire temperature range, and as a result the oscillator has to be re-measured to verify the compensation circuit settings.

Figure 7A:
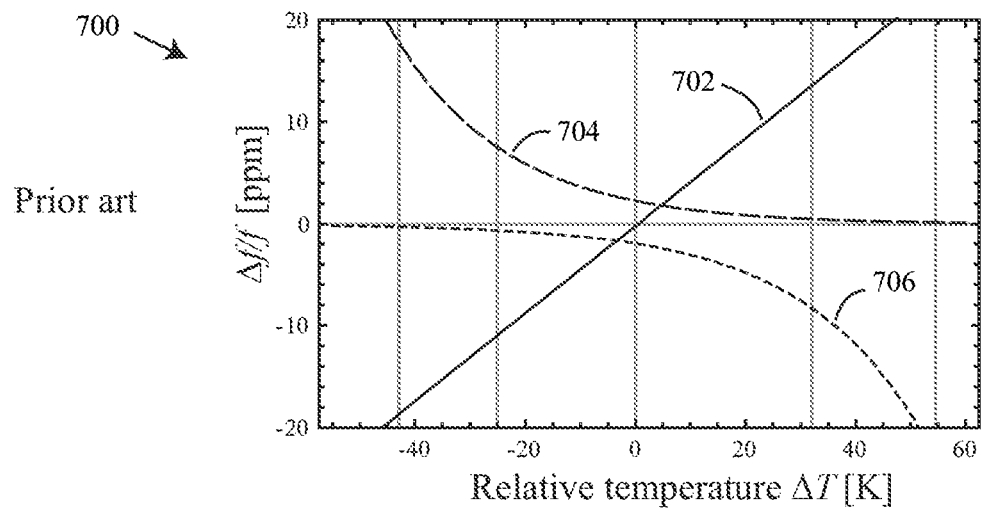
FIG. 7A illustrates tuning signal contributions associated with using one linear and two non-linear circuit elements.
Figure 7B:
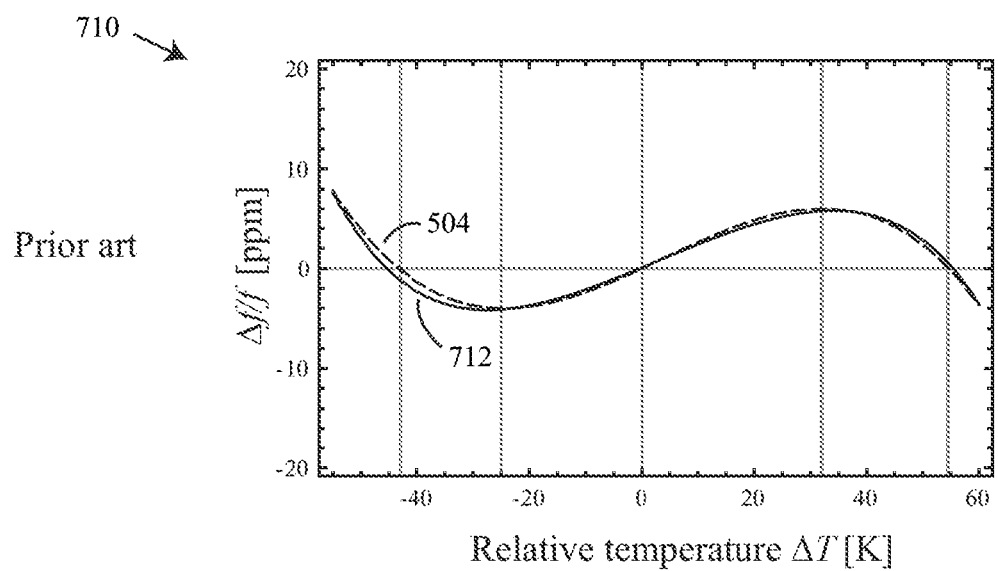
FIG. 7B is a comparison of required and generated tuning signals using the composite tuning method according to the prior art.
Figure 7C:
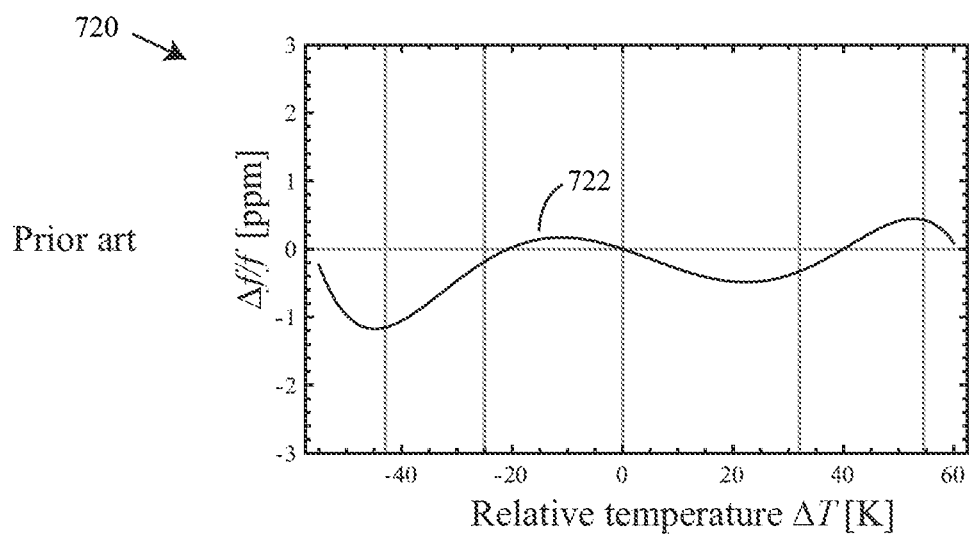
FIG. 7C illustrates the relative frequency error of the composite tuning network of the prior art resulting from use of the tuning signal of FIG. 7B.

Another approach found in literature is to separate the tuning signal into one linear contribution 702 and two highly non-linear signals 704 and 706, as shown in plot 700 of FIG. 7A. Using an optimized combination thereof yields a compensation signal 712, shown in plot 710 of FIG. 7B, that is very close to the optimum tuning signal 504 previously described. As a result an oscillator using this tuning method achieves a temperature stability illustrated in plot 720 of FIG. 7C as line 722. In this case the frequency error of initially ±8 ppm has been reduced to about ±1 ppm. Nevertheless, a residual error exists due to the limitations of the compensation contributions 702, 704 and 706. Again, as seen previously for the resistive network compensation circuit of FIG. 6A, the contributions 702, 704 and 706 are not exclusive for a particular temperature range. For example, at a relative temperature of −20K the tuning signal contains a large contribution from 702, a significant contribution from 704 and a minor contribution from 706. This means that, for example, adjusting contribution 704 will have a significant effect on the tuning signal over the entire temperature range. This means that the three contributions cannot be adjusted individually, but instead that all three contributions have to be adjusted as part of an optimizing algorithm after the relative frequency error of the oscillator is known over temperature.

Figure 8:
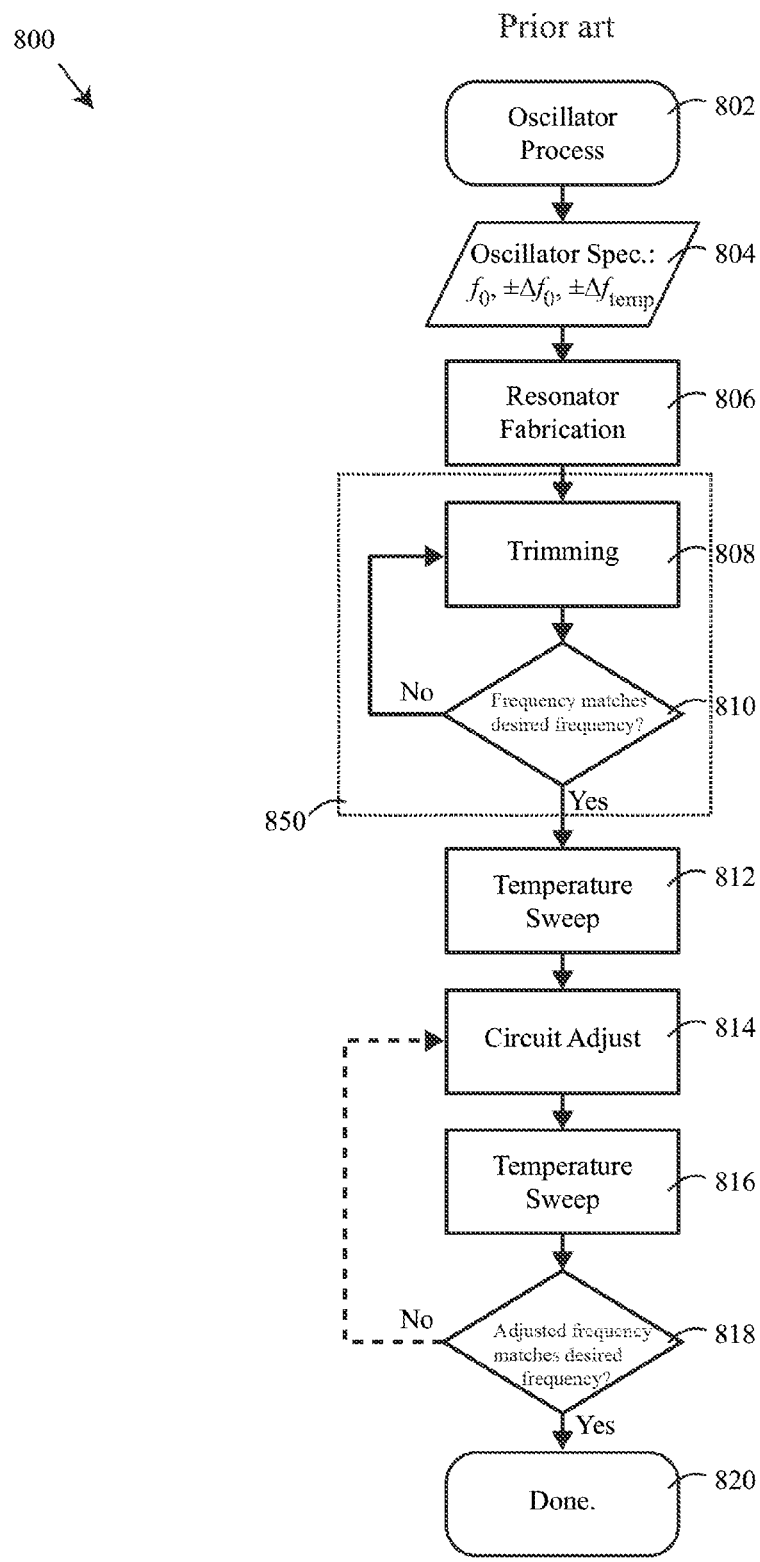
FIG. 8 is a flow chart of a calibration procedure for prior art oscillators using mechanical resonators.

In general, the calibration procedure for TCXOs with quartz crystal resonators involves multiple temperature sweeps over the entire operating temperature range. The process 800 is shown in FIG. 8. The oscillator fabrication process 802 starts at step 804 with the definitions of the oscillator frequency, e.g., 26 MHz, and definition of the tolerances, including the initial frequency accuracy of e.g. ±1.5 ppm, temperature range, e.g., from −40° C. to +85° C. and corresponding temperature stability of the frequency of ±2.5 ppm. The quartz crystal resonator is then fabricated 806 and undergoes a trimming process 850 so that the frequency of the oscillator matches the target frequency of, in this case, 26 MHz with very high accuracy. The trimming sequence consists of the actual trimming step 808, in which material is removed or added to the resonator and a comparison step 810, in which the obtained oscillator frequency is compared to the desired frequency, which might include some specified offset. If the comparison of these two frequencies is acceptable, the process continues, otherwise the trimming step 808 is repeated and the trimming sequence iterated until the part passes or is classified a faulty part.

Next, in step 812 the oscillator is swept over temperature to evaluate the temperature characteristics. This involves setting the oscillator to a large number (typically around 1,200) of precise temperatures over the anticipated operating temperature range and measuring the oscillator output frequency at each of these temperatures. Then in step 814, based on the extracted relative frequency error over temperature of the oscillator the temperature compensation circuit is adjusted for that particular oscillator. To verify that the oscillator fulfills the specifications of e.g. ±2.5 ppm over the entire temperature range the oscillator is then measured over the temperature range once more in step 816. Step 818 is required to ensure that the adjusted oscillator meets the specifications. If the oscillator passes this stage it is complete (820). If it does not pass, the part might be re-adjusted (step 814) and the measurement procedure 816 repeated or the part classified as faulty.

The existing procedure for obtaining TCXOs shown in FIG. 8 has several drawbacks.

First, each oscillator behaves differently so that each oscillator has to be measured over the entire temperature range and adjusted individually. Second, the temperature measurements require a very high accuracy on the temperature control during the measurement. As a result, the temperature slope for the measurement is very low and the measurement procedure takes a lot of time. Because the temperature sweep is performed twice (i.e., steps 812 and 816), the time is even greater.

One reason for taking very high density frequency measurements over temperature (i.e., a temperature sweep) is the existence of activity dips, also referred to as Q-dips, particular to quartz resonators. This phenomenon relates to a multitude of acoustic modes existing in any given quartz resonator structure. Although the main resonance mode is inherently very temperature stable, other unused and undesirable modes nevertheless exist and these modes are not necessarily temperature compensated. As a result, unwanted modes with frequencies in the vicinity of the main mode that posses a large temperature coefficient of frequency can, for a given temperature, approach and cross the main mode. In these cases the energy supplied to the resonator by the oscillator circuit is also supplied and stored in these unwanted modes. Moreover, energy stored in the main mode and the unwanted mode can also interact, which is often referred to as coupling. As a result, the oscillator frequency for a temperature at which an unwanted mode approaches the main mode closely enough might show a sudden increase or decrease in frequency, referred to as "dip". The existence of activity dips is very hard to predict, as it depends on the exact resonator geometry, crystal cut-angle, electrode geometry and the mounting of the resonator. Thus, to discover and account for such dips, the conventional calibration routine of FIG. 8 requires the temperature sweep with a large number of temperatures.

According to one aspect of the technology described herein, a procedure for calibrating temperature compensated oscillators, including TCXOs, is provided that is much faster than conventional methods, and only requires the measurement of the oscillator frequency at a small number of temperatures, as few as two, three or four temperatures. According to another aspect, compensation circuits are provided for performing the method just described, and include independently controllable components for calibrating the compensation circuit at respective temperatures.

Figure 9:
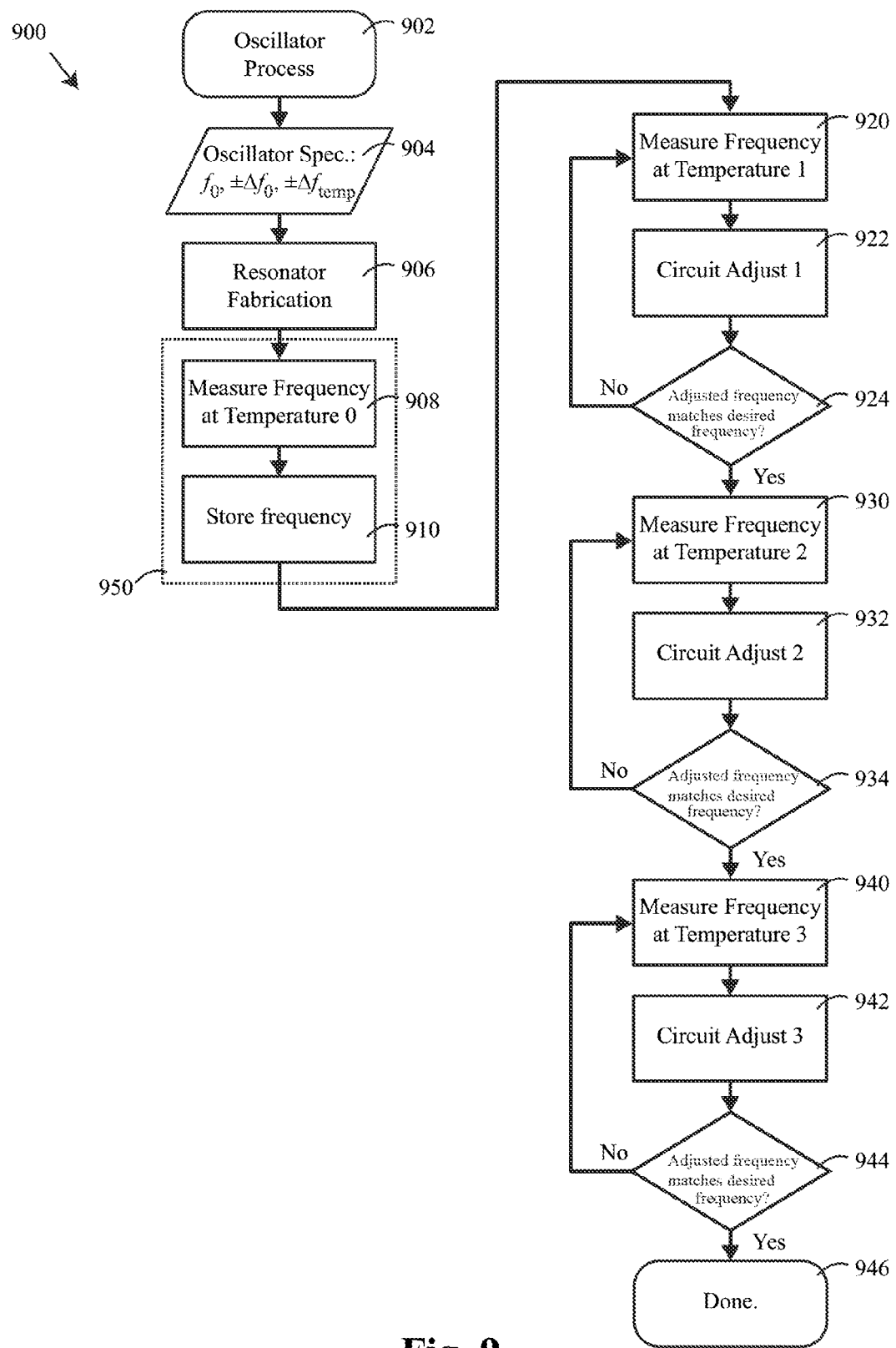
FIG. 9 is a flow chart of a calibration procedure for oscillators using mechanical resonators according to one embodiment.

A non-limiting example of a procedure for calibrating oscillators having mechanical resonators according to an aspect of the technology is shown in FIG. 9. The oscillator fabrication process 902 starts with the definitions of the oscillator frequency, e.g., 125 MHz, and definition of the tolerances, including the initial frequency accuracy of e.g., ±2.5 ppm, temperature range, e.g., from −40° C. to +85° C. and corresponding temperature stability of the frequency of ±2.5 ppm. Additional specifications are possible. The resonator is then fabricated 906.

The next step depends on whether an arbitrary frequency oscillator is being formed or a non-arbitrary frequency oscillator. As used herein, "arbitrary frequency" refers to a frequency not substantially matching a conventional standard oscillator frequency. For example, the arbitrary frequency may differ by at least 30 parts per million (ppm) from a standard oscillator frequency in some embodiments. In some embodiments, the arbitrary frequency may differ by at least 50 ppm from a standard oscillator frequency, by at least 100 ppm, by at least 200 ppm, by at least 500 ppm, by at least 1,000 ppm, or by between approximately 1,000 ppm and 10,000 ppm (e.g., 2,000 ppm, 5,000 ppm, or any other value within this range), among other possible amounts of deviation. The term "arbitrary frequency" as used herein does not imply the frequency is not known or cannot be measured. Rather, an arbitrary frequency may be measured or otherwise have its value determined In some embodiments in which an arbitrary frequency oscillator is being formed (i.e., an oscillator not required to meet a conventional or standard oscillator frequency (e.g., 26 MHz)), the oscillator frequency is measured at a first temperature (step 908), e.g., around room temperature with a rather large tolerance on the temperature accuracy, and the frequency of the oscillator recorded at 910 within, for example, memory of the oscillator or a test-computer. In this manner, the initial frequency of the oscillator may be available for future reference. In an alternative embodiment in which an arbitrary frequency oscillator is being formed, the step 950 may be omitted since the initial frequency value can be arbitrary, so that step 920 may be performed directly after step 906. For those embodiments in which an oscillator of non-arbitrary frequency is being formed (i.e., an oscillator with a frequency intended to meet a conventionally accepted oscillator frequency (e.g., 26 MHz)), the illustrated step 950 may be replaced with a trimming step of the type previously described with respect to step 850.

In step 920 the oscillator is exposed to a well-defined first temperature (Temperature 1), which is controlled within an accuracy of ±5 K, ±1 K, ±0.5 K or even ±0.1 K, as non-limiting examples. Larger values are also possible. The oscillator frequency is then measured. The compensation circuit within the oscillator is then adjusted (step 922) and the resulting (adjusted) oscillator frequency is compared to the desired frequency in step 924. The procedure of measuring 920, adjusting 922 and comparing 924 is repeated until the oscillator frequency matches the desired frequency at the first temperature.

It should be understood that the desired frequency may be any suitable value, and that the method illustrated in FIG. 9 is not limited in this respect. According to one embodiment, the desired frequency may be the frequency determined and stored in step 910, or it may be the frequency measured in step 920. In such situations, no circuit adjustment may be necessary at 922. In alternative embodiments, the desired frequency may be computed based on the stored frequency in 910 and the measured frequency of step 920. It should also be appreciated that the frequency used for comparison in step 924 may be the frequency determined and stored in step 910 including a defined offset, may be the frequency measured in step 920 with a specified offset, or may be a frequency computed based on the stored frequency in 910 and the measured frequency of step 920 including an offset, among other possibilities.

In step 930 the oscillator is exposed to a well-defined second temperature (Temperature 2), which is controlled within an accuracy of ±5 K, ±1 K, ±0.5 K or even ±0.1 K, as non-limiting examples. Larger values are also possible. The oscillator frequency is then measured. The compensation circuit within the oscillator is then adjusted (step 932) and the resulting (adjusted) frequency is compared to the desired frequency in step 934. The procedure of measuring 930, adjusting 932 and comparing 934 is repeated until the oscillator frequency matches the desired frequency. In one embodiment, the desired frequency used for comparison in 934 is the same as the frequency used for the comparison in 924. Alternatively, in some embodiments the desired frequency in 934 may be chosen to include an offset to the desired frequency used in 924.

In step 940 the oscillator is exposed to a well-defined third temperature (Temperature 3), which is controlled within an accuracy of ±5 K, ±1 K, ±0.5 K or even ±0.1 K, as non-limiting examples. Larger values are also possible. The oscillator frequency is then measured. The compensation circuit within the oscillator is then adjusted 942 and the resulting (adjusted) frequency is compared to the desired frequency in step 944. The procedure of measuring 940, adjusting 942 and comparing 944 is repeated until the oscillator frequency matches the desired frequency (in which case the procedure is completed at 946). In one embodiment, the desired frequency used for comparison in 944 is the same as the frequency used for the comparison in 924 and 934. In some embodiments the desired frequency in 944 may be chosen to comprise an offset to the desired frequency used in 934.

If the oscillator has passed step 944, it is complete. If the oscillator repeatedly does not pass the comparison steps 924, 934, or 944 or if the frequency despite the adjustment is not able to approach the comparison frequency, the part is classified as faulty and taken out of the procedure. It should be further appreciated that the embodiment shown in FIG. 9 containing three temperature points and circuit adjustment steps can be extended to comprise additional temperatures and circuit adjustment steps, and can contain four, five or even six such calibration steps and is not limited in this respect. The greater the number of temperatures measured, the greater the accuracy of the calibration.

The method illustrated in FIG. 9 may be used beneficially for oscillators including various types of mechanical resonators. For example, the method may be used beneficially for oscillators having microelectromechanical systems (MEMS) resonators. The method may also be used beneficially for oscillators using quartz resonators, thus avoiding the temperature sweeps associated with the conventional method of FIG. 8 for calibrating such oscillators.

Figure 10:
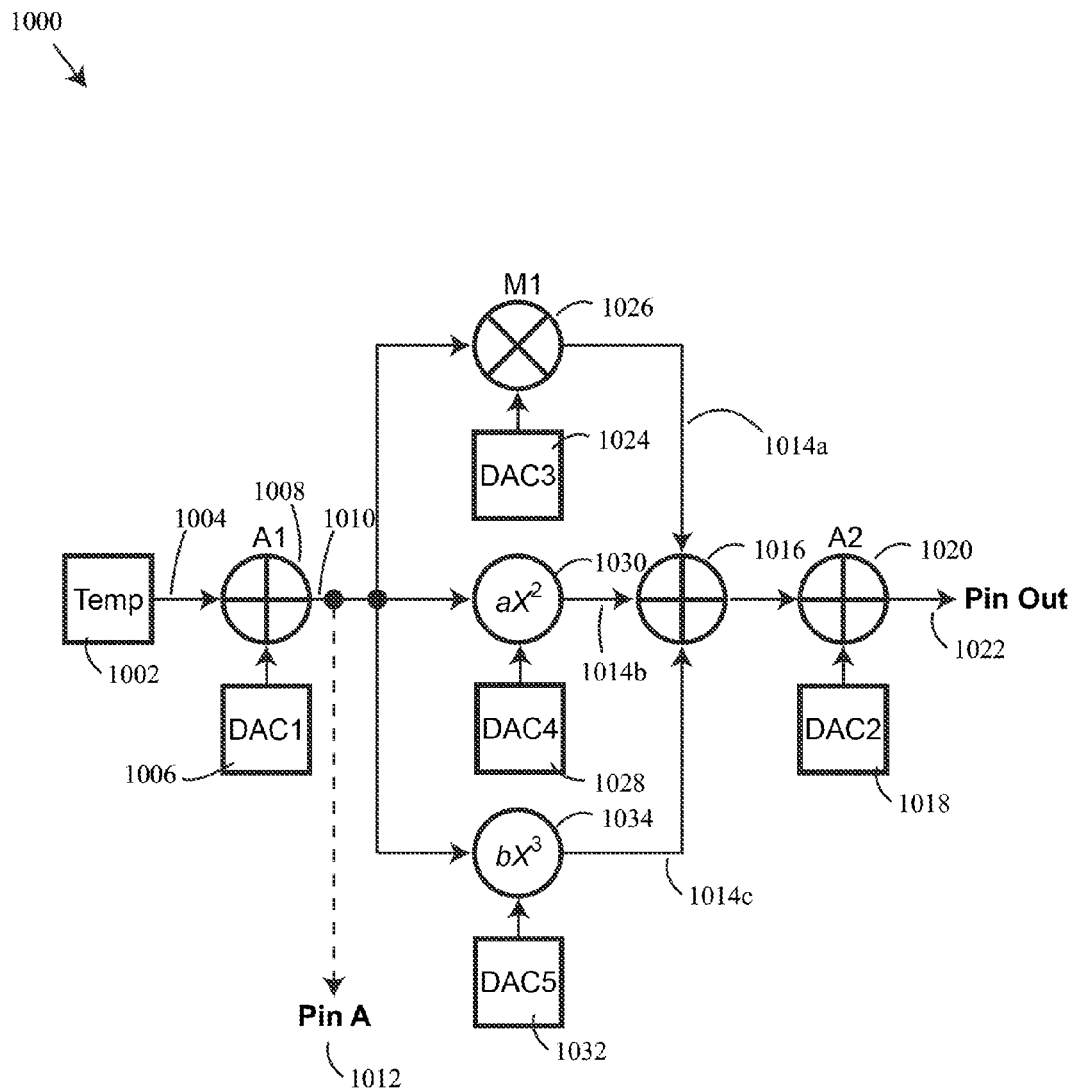
FIG. 10 is a block diagram of a temperature compensation circuit using polynomial parameters according to one embodiment.

One embodiment of a temperature compensation circuit which may utilize the calibration procedure 900 is shown in block diagram form in FIG. 10. It comprises a temperature sensor 1002 that outputs a current, voltage or charge dependent on the temperature. Initially, the digital to analog converters 1024, 1028, 1032 are all set to their smallest value, i.e., zero.

The calibration of circuit 1000 of FIG. 10 may depend on the type of resonator being used with the oscillator of which the circuit 1000 is a part. If an AT-cut crystal is used that is trimmed to a specific frequency the sequence 950 may be replaced with the trimming procedure 850. For an arbitrary frequency oscillator, sequence 950 may be used or omitted depending on whether a circuit adjustment is necessary at the first step or not, as discussed above. In explaining the calibration of circuit 1000, we will assume that the procedure 950 is omitted.

The circuit is initially set to a desired first temperature at step 920, for example by adjusting the circuit temperature until the temperature sensor 1002 indicates the circuit is at the desired temperature. As a non-limiting example, if the temperature sensor outputs a signal indicative of a difference between the desired temperature and the actual temperature, then the circuit temperature may be adjusted until the output of the temperature sensor 1002 is nulled. The frequency of the oscillator is then measured at step 920. This first temperature step can be chosen arbitrarily, but a temperature close to the center of the expected operating temperature range of the oscillator is advantageous. Room temperature (25° C.) is a preferred temperature, however, other temperatures are also possible. At this first temperature step, the electrical signal at 1010 is measured by measuring the electrical signal at Pin A 1012. The electrical signal 1010 is the sum of the temperature sensor signal 1004 and a value stored in element 1006 (a digital-to-analog converter (DAC) in this non-limiting embodiment) formed by the adder 1008. The objective is to null the signal 1010. By adjusting the value of DAC 1006 and measuring the output signal at 1012 the signal 1010 is set to zero. As shown, a special pin (e.g., pin 1012) might be available on the oscillator to measure signal 1010. However, other embodiments are possible. For example, signal 1010 may be provided at the oscillator output. In still other embodiments, the measurement of 1010 might occur internally and a value relating to the level of signal 1010 might be accessible through memory in the oscillator that is also accessible from the outside.

As mentioned, by suitably adjusting the value of 1006, the signal 1010 is zero at the first temperature. As a result, the signals 1014a, 1014b and 1014c are also zero. Therefore, the output signal of the adder 1016 is also zero. The tuning circuit output signal 1022 from adder 1020 is therefore determined by the value stored in 1018 (also a DAC in this non-limiting embodiment). This value can be either left as is, corresponding to the case where the desired frequency is chosen as the frequency measured in step 920 and therefore no adjustment is necessary or the value is adjusted to match a desired frequency based on the oscillator specifications from step 904, the frequency stored in step 910, or the value measured in step 920, or a combination of the former three, including any arbitrary offset. The value of DAC 1018 can also be chosen to match a certain number of significant digits, e.g., if the measured frequency in step 920 is, e.g., 124,897,064.26 Hz the desired frequency could be chosen to require fewer significant digits, e.g., 124,897,000.00 Hz. No matter how it is chosen, this first frequency that is used for the adjustment criteria is referred to as the desired frequency.

Figure 11A:
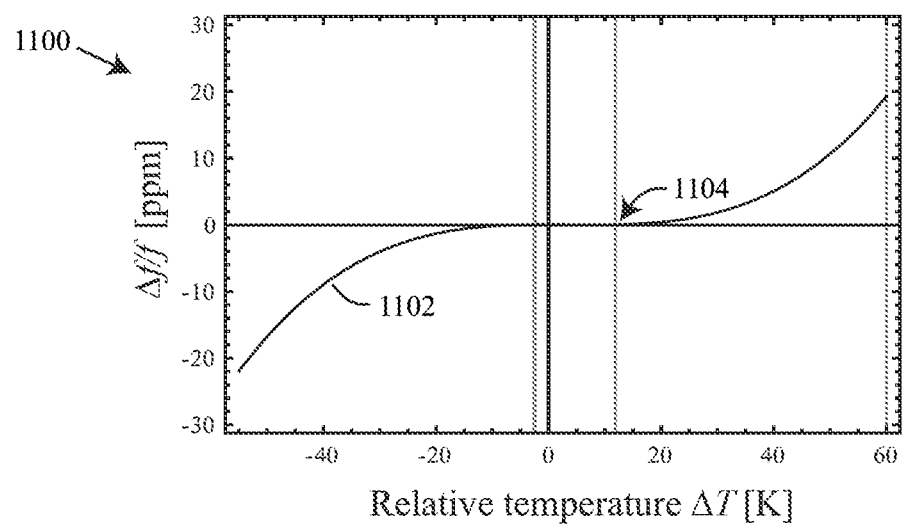
FIG. 11A illustrates the relative frequency error residual after a first step of a polynomial temperature calibration scheme applied to an oscillator using an AT-cut quartz resonator.

In the next step, the linear coefficient of the temperature characteristics of the oscillator is adjusted. The oscillator is brought to the second temperature, step 930, and the frequency of the oscillator measured. The linear term of the compensation signal, which is produced by mixer 1026 (M1)

and is controlled by DAC 1024, is then adjusted at step 932 by programming 1024 so that the oscillator output (not shown in FIG. 10) is equal to the desired frequency or offset from the desired frequency by a specific amount, i.e., until the result passes at comparison step 934. As a result the oscillator is now compensated to first order. The typical temperature dependent frequency response 202 of an AT-cut quartz crystal is shown in plot 200 of FIG. 2 before linear compensation. The temperature dependent frequency response 1102 after the linear compensation just described is shown in plot 1100 of FIG. 11A. The point indicated by 1104 represents the working point (at a temperature represented by the corresponding vertical line) where the frequency error is minimized by adjusting the circuit as just described. In the various plots shown herein relating to aspects of the present invention, the vertical gray lines represent temperatures which may be used in the calibration processes (e.g., Temperature 1, Temperature 2, Temperature 3, etc.).

Figure 5B:
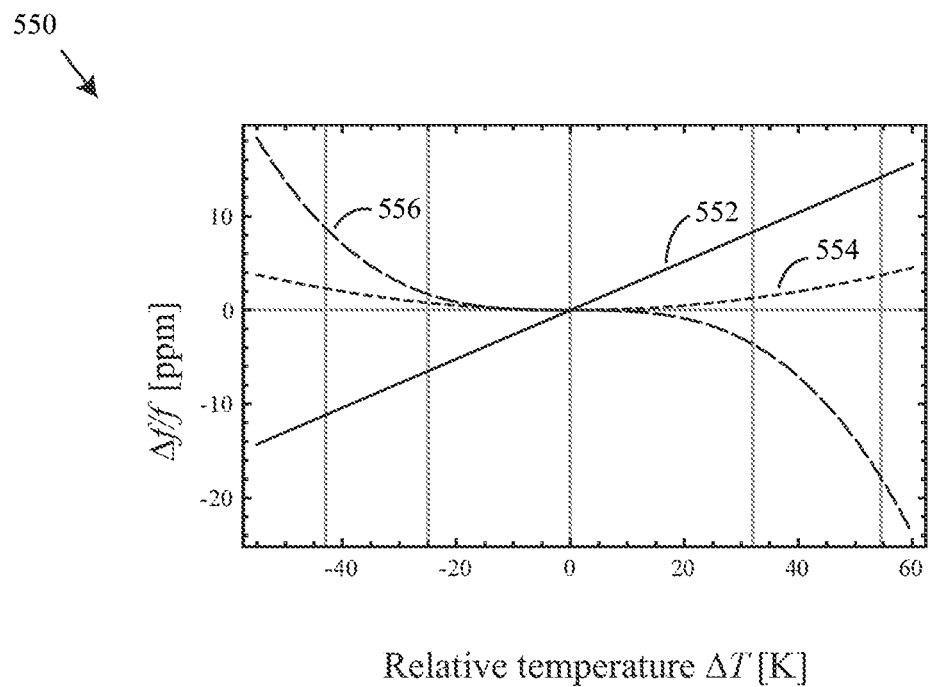
FIG. 5B illustrate the first, second and third order contributions of the tuning signal for an oscillator using an AT-cut quartz crystal.

As seen from FIG. 5B, the frequency response of the AT-cut crystal also comprises large second and third order components. To extract the linear temperature adjustment correctly according to the methodology of operation of circuit 1000, a temperature is chosen where the second and third order coefficients are equal in amplitude, but opposite in sign. For AT-cut crystals, depending on the electrode materials and thickness, this temperature is between 34° C. and 39° C. Thus, this temperature range is preferred for adjusting the linear coefficient.

Figure 11B:
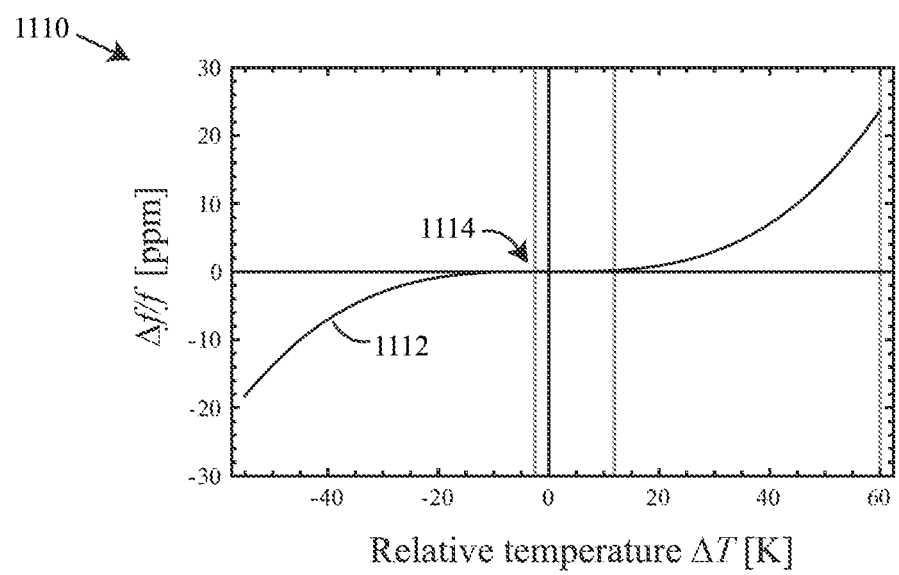
FIG. 11B illustrates the relative frequency error residual after a second step of the polynomial temperature calibration scheme applied to an oscillator using an AT-cut quartz resonator.

In the third temperature step the quadratic temperature dependence is adjusted. Element 1028 (a DAC in this non-limiting example) is adjusted to yield a quadratic term 1030 that is added by adder 1016 to the already adjusted linear signal 1014a. Because the second order contribution is larger than the third order coefficient close to the first temperature, a third temperature is chosen that lies either in between the first and second temperatures or that lies below the first temperature but within some range of the first temperature, the range being defined by the difference of the first temperature minus the second temperature. Other temperatures for the third temperature are also possible, especially if the resonator is not an AT-cut crystal. After adjusting the circuit for the third temperature to match the desired frequency, possibly including an offset, the oscillator passes the comparison 944 and the resulting temperature dependent frequency response including a first and second order compensation is shown in FIG. 11B. The point indicated by 1114 represents the working point where the frequency error is minimized by adjusting the circuit, and the vertical gray lines represent the temperatures used during the calibration process.

Figure 11C:
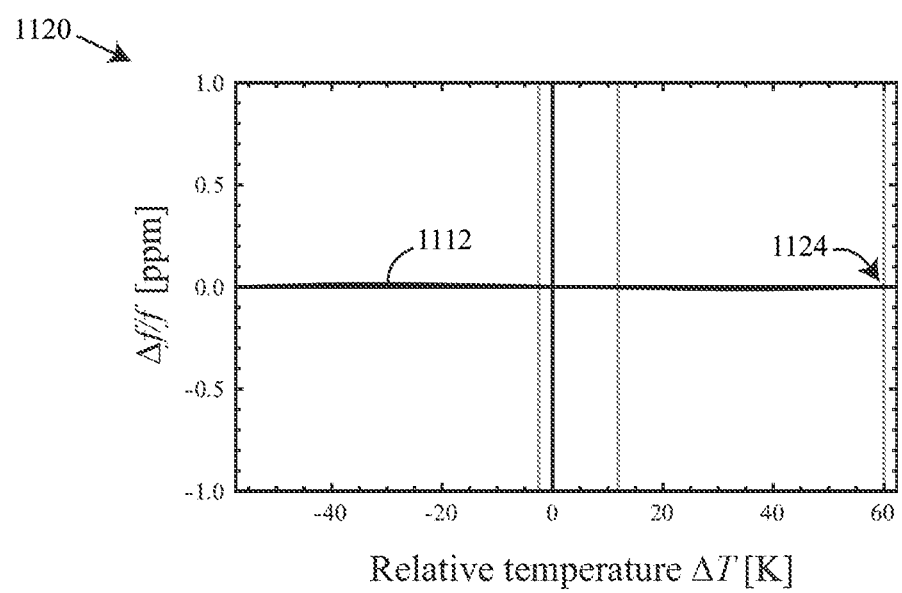
FIG. 11C illustrates the relative frequency error residual after a third step of the polynomial temperature calibration scheme applied to an oscillator using an AT-cut quartz resonator.

As seen from plot 1110 of FIG. 11B the frequency response 1112 still contains a large third order contribution, which may be removed with a measurement at another temperature in addition to those illustrated in FIG. 9 (i.e., at a "Temperature 4" after the processing at "Temperature 3"). While this additional processing at yet another temperature is not illustrated in FIG. 9 for purposes of simplicity of the illustration, it should be understood that the processing at this additional temperature is identical to the processing performed at the first, second and third temperatures (i.e., Temperatures 1-3), meaning that the processing involves measuring the oscillator frequency at Temperature 4 and then adjusting the circuit to provide the desired frequency response at that temperature, and repeating as necessary. At this fourth temperature, the value of which is chosen close to extremes of the expected operating temperature range of the oscillator, the cubic component 1034 in FIG. 10 is adjusted using the DAC 1032 until the desired frequency is reached, possibly including an offset. After passing this comparison the part is completed. The frequency response of the fully adjusted oscillator is shown in plot 1120 of FIG. 11C. The point indicated by 1124 represents the working point where the frequency error is minimized by adjusting the circuit as just described. As shown, the frequency error of 1112 is well below the typical temperature stability of AT-cut crystal based oscillators.

Figure 12:
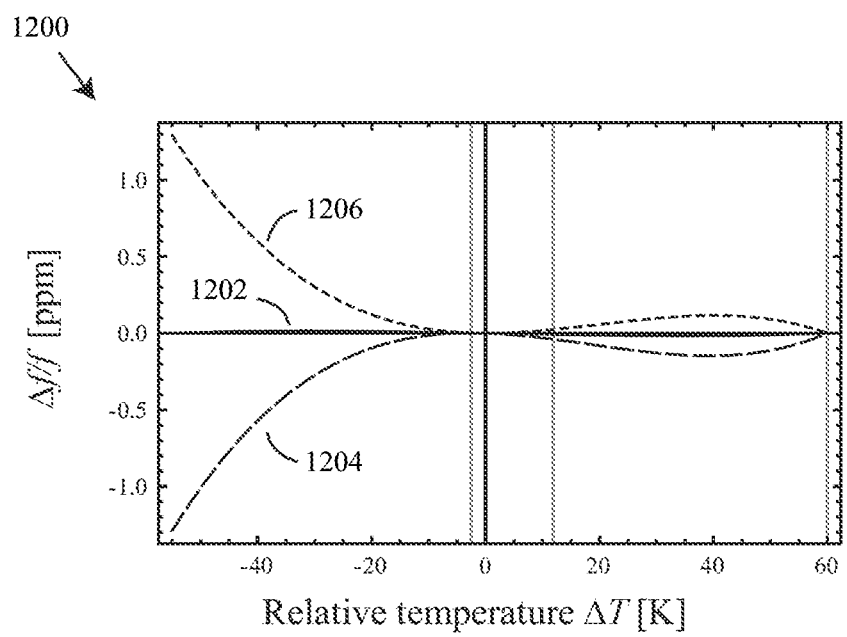
FIG. 12 illustrates the relative frequency error residual for multiple cut-angle inaccuracies of an oscillator using an AT-cut quartz resonator.

As mentioned, the temperature dependent frequency response of a crystal oscillator may depend on the cut angle of the oscillator. Applying the calibration procedure just described to AT-cut crystal-based oscillators for the three different cut angles used to generate the frequency response curves of plot 300 in FIG. 3 results in the three corresponding curves shown in plot 1200 of FIG. 12, where 1202 corresponds to the initial curve 202 after compensation using the method of FIG. 9, 1204 corresponds to 304 after compensation, and 1206 corresponds to 306 after compensation. It is apparent that the temperature error is very small for the temperature range spanned by the smallest and largest measurement temperature. However, for temperatures outside of the temperature range spanned by the calibration temperatures the error is considerable. In this example negative temperatures have been avoided, i.e. the smallest temperature in this example is 22.5° C. To reduce the frequency error for negative temperatures, several methods can be used. One method expands the temperature test range to include negative temperatures. Another method is based on using a known offset for the frequency adjustment to account for the negative temperatures. Another method uses an offset added or subtracted to the temperature sensor.

Figure 13A:
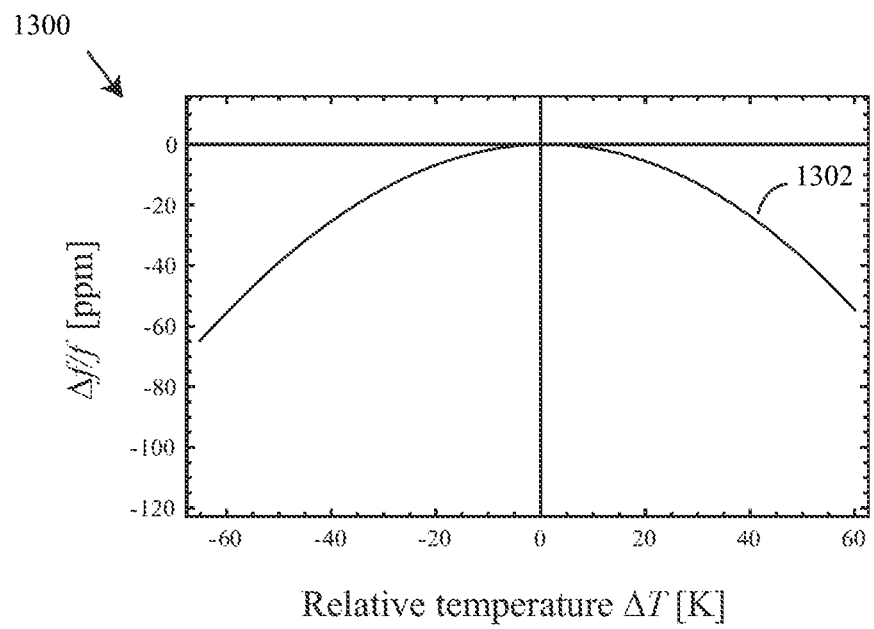
FIG. 13A illustrates the relative frequency error of a Lamb wave resonator on a composite silicon dioxide and silicon stack.

The foregoing discussion of calibration techniques has been focused on the context in which an oscillator, prior to compensation, exhibits a temperature dependent frequency response having the shape shown in FIG. 2, as is typical for conventional crystal oscillators. However, an alterative temperature dependent frequency response is seen for some types of Lamb wave resonators using special temperature compensated stacks. For example, plot 1300 of FIG. 13A illustrates an alternative shape of a temperature dependent frequency response of an oscillator, shown by the line 1302. A frequency response like that shown in FIG. 13A may be exhibited by the types of resonators having a temperature compensated stack comprising layers of silicon dioxide, silicon, and silicon dioxide, as described in U.S. patent application Ser. No. 12/639,161, filed on Dec. 16, 2009 and entitled, "Mechanical Resonating Structures Including a Temperature Compensation Structure," and published as U.S. Patent Application Publication No. US-2010-0182102-A1 on Jul. 22, 2010, which is hereby incorporated herein by reference in its entirety. In this case the turnover temperature (i.e., the temperature at which the frequency response hits a peak value, like that shown in FIG. 13A) is designed to lie close to the center of the temperature operating range. As with most materials, silicon has a large negative first order coefficient of frequency, a large second order contribution and a significant third order contribution, related to the stiffness dependence over temperature and thermal expansion dependence over temperature. Silicon dioxide possesses the rare characteristic that the stiffness increases with increasing temperature. This rare characteristic can be used to create temperature stable resonators by matching the silicon dioxide thickness to the silicon thickness. As a result the first order temperature dependence can be accounted for, as shown in FIG. 13A. However, a large second order dependence remains as seen from FIG. 13A, that also includes a significant third order contribution that is hard to make out from trace 1302.

Figure 13B:
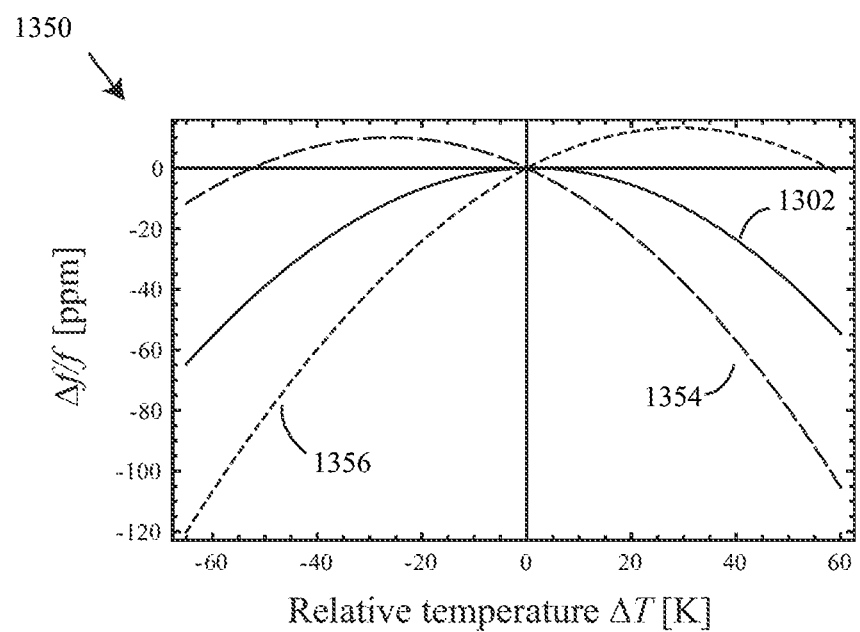
FIG. 13B illustrates the relative frequency error of a Lamb wave resonator on a composite silicon dioxide and silicon stack with for various thicknesses of the silicon layer.

As previously described, for an AT-cut crystal the cut angle dependence of the crystal resonator is one of the biggest factors that influences the resulting temperature characteristics, as shown in FIG. 3. For the case of a composite compensating layer stack (e.g., a composite stack including silicon sandwiched between layers of silicon dioxide, as described in the above-incorporated U.S. patent application Ser. No. 12/639,161) including one or more compensating material layers, the temperature characteristics are influenced by the thickness tolerances in manufacturing the composite stack. The effect of the thickness variations for a compensated stack resonator are shown in FIG. 13B. The calibration procedure described herein is versatile enough to account for these variations of the temperature characteristics originating from the thickness variations. It should be appreciated that not only the thickness tolerances affect the temperature characteristics of the resonator, but also the control and repeatability of the resonator geometry and the material properties of the materials involved should be well controlled, including stiffness, intrinsic stress, chemical composition, as well as the temperature profile and related annealing effects that can influence the material properties during fabrication as well as during operation.

Figure 14A:
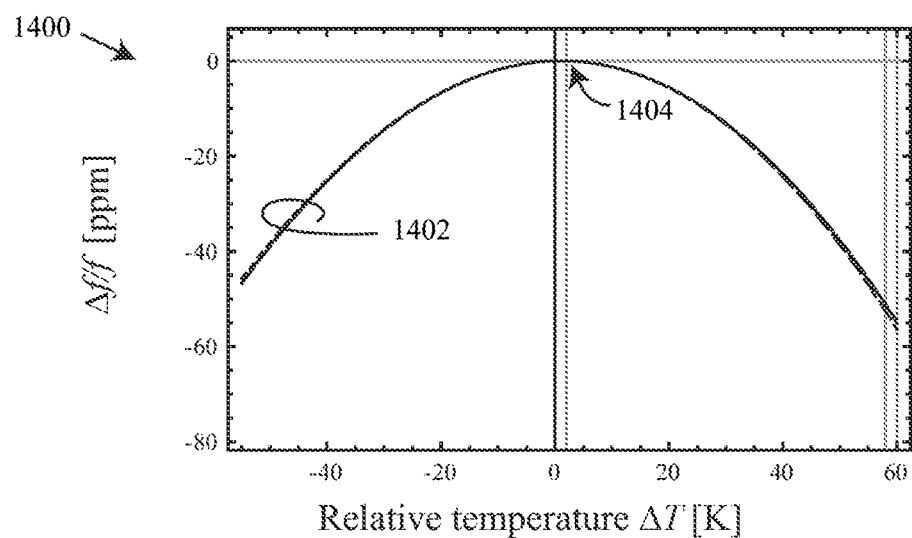
FIG. 14A illustrates the relative frequency error residual after a first step of a polynomial temperature calibration scheme applied to an oscillator using a Lamb wave resonator on a composite silicon dioxide and silicon stack.
Figure 14B:
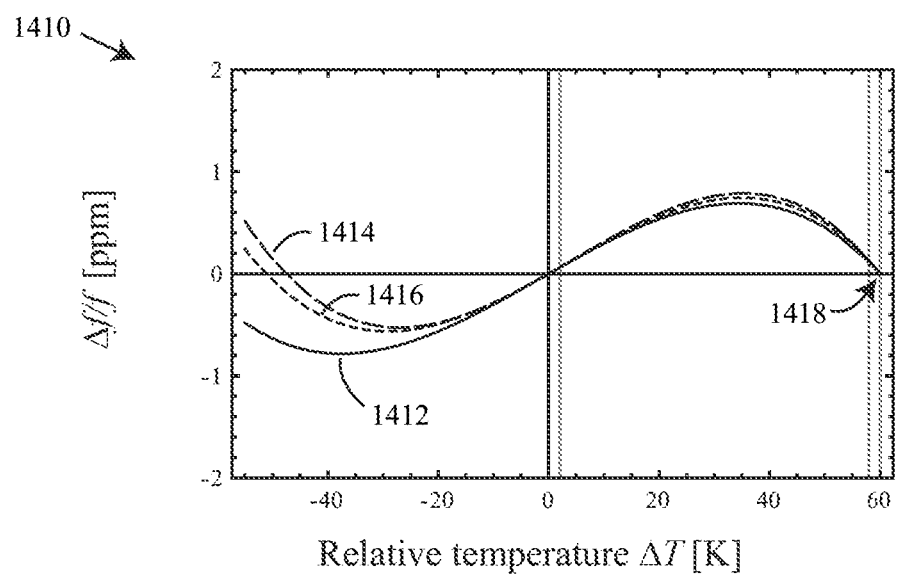
FIG. 14B illustrates the relative frequency error residual after a second step of the polynomial temperature calibration scheme applied to an oscillator using a Lamb wave resonator on a composite silicon dioxide and silicon stack.
Figure 14C:
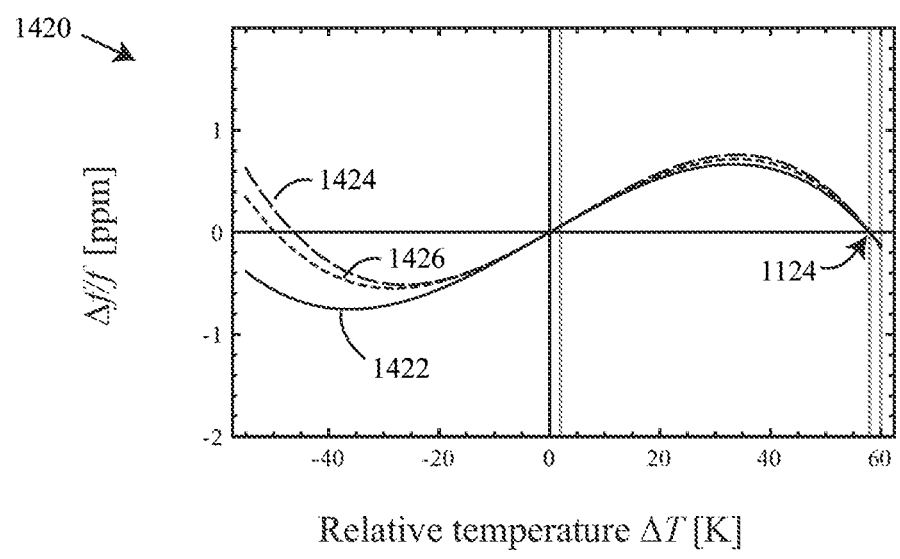
FIG. 14C illustrates the relative frequency error residual after a third step of the polynomial temperature calibration scheme applied to an oscillator using a Lamb wave resonator on a composite silicon dioxide and silicon stack.

The results of applying the calibration procedure shown in FIG. 9 to a compensated stack resonator having the pre-calibration frequency response shown in FIG. 13A (e.g., of the type described in the above-incorporated U.S. patent application Ser. No. 12/639,161) are shown in FIGS. 14A-C. For an arbitrary frequency oscillator the sequence 950 may be used or omitted depending on whether a circuit adjustment is necessary at the first step or not, as discussed above. We will assume here that the procedure 950 is omitted.

The circuit is initially set to a desired first temperature at step 920, for example by adjusting the circuit temperature until the temperature sensor 1002 indicates the circuit is at the desired temperature. As a non-limiting example, if the temperature sensor outputs a signal indicative of a difference between the desired temperature and the actual temperature, then the circuit temperature may be adjusted until the output of the temperature sensor 1002 is nulled. The frequency of the oscillator is then measured at step 920. This first temperature step can be chosen arbitrarily, but a temperature close to the center of the expected operating temperature range of the oscillator is advantageous. Room temperature (25° C.) is a preferred temperature, however, other temperatures are also possible. At this first temperature step, the electrical signal at 1010 is measured by measuring the electrical signal at Pin A 1012. The electrical signal 1010 is the sum of the temperature sensor signal 1004 and a value stored in element 1006 (a DAC in this non-limiting embodiment) formed by the adder 1008. The objective is to null the signal 1010. By adjusting the value of DAC 1006 and measuring the output signal 1010 the signal 1010 is set to zero. As shown, a special pin (e.g., pin 2010) might be available on the oscillator to measure signal 1010. However, other embodiments are possible. For example, signal 1010 may be provided at the oscillator output. In still other embodiments, the measurement of 1010 might occur internally and a value relating to the level of signal 1010 might be accessible through memory in the oscillator that is also accessible from the outside.

As mentioned, by suitably adjusting the value of 1006, the signal 1010 is zero at the first temperature. As a result, the signals 1014a, 1014b and 1014c are also zero. Therefore, the output signal of the adder 1016 is also zero. The tuning circuit output signal 1022 is therefore determined by the value stored in 1018. This value can be either left as is, corresponding to the case where the desired frequency is chosen as the frequency measured in step 920 and therefore no adjustment is necessary or the value is adjusted to match a desired frequency based on the oscillator specifications from step 904, the frequency stored in step 910, or the value measured in step 920, or a combination of the former three, including any arbitrary offset. The value of DAC 1018 can also be chosen to match a certain number of significant digits, e.g., if the measured frequency in step 920 is e.g., 124,897,064.26 Hz the desired frequency could be chosen to require fewer significant digits, e.g., 124,897,000.00 Hz. No matter how it is chosen, this first frequency that is used for the adjustment criteria is referred to as the desired frequency.

In the next step, the linear coefficient of the temperature characteristics of the oscillator is adjusted. The oscillator is brought to the second temperature, step 930, and the frequency of the oscillator measured. The linear term of the compensation signal, which is produced by mixer 1026 (M1) and is controlled by DAC 1024 is then adjusted at step 932 by programming 1024 so that the oscillator output (not shown in FIG. 10) is equal to the desired frequency or offset from the desired frequency by a specific amount, i.e., until the result passes at comparison step 934. As a result the oscillator is now compensated to first order. The typical temperature dependent frequency response of stack compensated resonators before compensation, 1302, 1354 and 1356 are shown in plot 1350 of FIG. 13B. After this first compensation step the results shown in plot 1400 of FIG. 14A are obtained, where it is hard to separate the different traces from each other, as indicated by 1402. The point indicated by 1404 represents the working point where the frequency error is minimized by adjusting the circuit as just described.

To ensure the turnover temperature coincides with the center of the temperature operating range, the second temperature is chosen very close to the center of the temperature range or the first temperature. This decision is based on the temperature characteristics of the resonator. We had seen that for AT-cut crystals it is advantageous to use a temperature between 34° C. and 39° C. for the extraction of the linear coefficient. For a resonator that is dominated by linear and quadratic components, as is the case for almost all non-quartz mechanical resonators, the temperature used for the linear adjustment is chosen close to the center of the temperature range, i.e. within ±10K, ±20K, although other values are also possible.

In the third temperature step the quadratic temperature dependence is adjusted. Element 1028 is adjusted to yield a quadratic term 1030 that is added by adder 1016 to the already adjusted linear signal 1014a. Because the second order contribution is much larger than the third order coefficient for compensated stack resonators the third temperature is chosen to lie at one extreme of the temperature range. As positive temperatures are technically easier to obtain the maximum temperature of +85° C. is used in this case. After adjusting the circuit for the third temperature to match the desired frequency, possibly including an offset, the oscillator passes comparison 944 and the resulting temperature characteristics including first and second order compensation are shown in FIG. 14B. The point indicated by 1418 represents the working point where the frequency error is minimized by adjusting the circuit as just described.

As seen from plot 1410 of FIG. 14B the temperature characteristics of all three traces 1412, 1414 and 1416 still contain a large third order contribution. It should be noted that for some oscillator applications the temperature stability obtained after the second order compensation shown in FIG. 14B is satisfactory. It should be noted that the resulting temperature error after the second order compensation of the compensated stack resonator shown in FIG. 14B is superior to the error in AT-cut crystals after the second order compensation shown in FIG. 11B for comparison.

In the case of the residual frequency error over temperature not being sufficient, a fourth temperature may be used to reduce the effect of the third order contribution. Following the procedure described previously in connection with FIG. 10 for using a fourth temperature (i.e., a "Temperature 4" not illustrated in FIG. 9 but being used after "Temperature 3" in FIG. 9), the reduction of the third order dependence is only marginal, as seen from plot 1420 of FIG. 14C, in which 1424 corresponds to 1414 of FIG. 14B, 1426 corresponds to 1416 of FIG. 14B, and 1422 corresponds to 1412 of FIG. 14B. If the fourth temperature is chosen in between the second and third temperatures the characteristics for positive temperatures are improved at the cost of the frequency error for negative temperatures. Therefore, a modification to the calibration sequence may be made to provide even greater reduction of the frequency error.

Figure 15A:
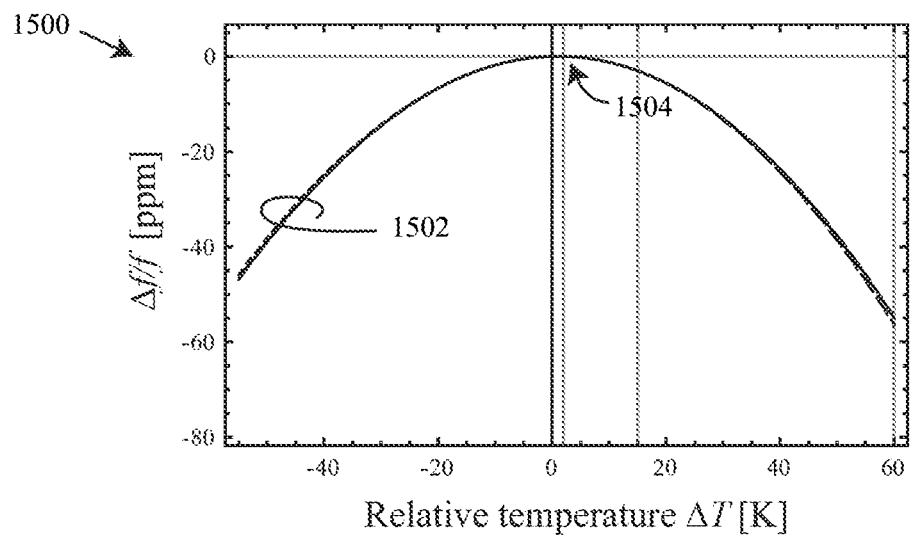
FIG. 15A illustrates the relative frequency error residual after a first step of a polynomial temperature calibration scheme with a linear re-adjust applied to an oscillator using a Lamb wave resonator on a composite silicon dioxide and silicon stack.
Figure 15B:
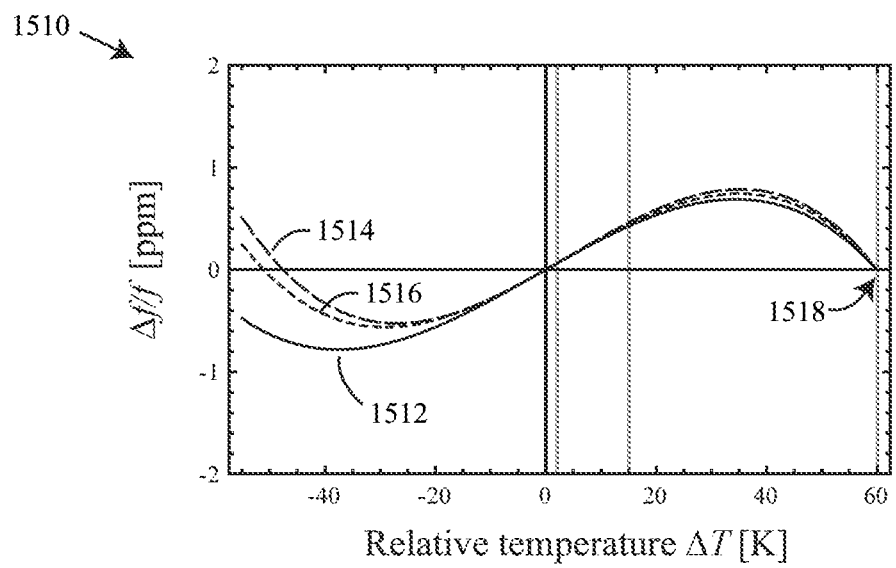
FIG. 15B illustrates the relative frequency error residual after a second step of the polynomial temperature calibration scheme with linear re-adjust applied to an oscillator using a Lamb wave resonator on a composite silicon dioxide and silicon stack.
Figure 16A:
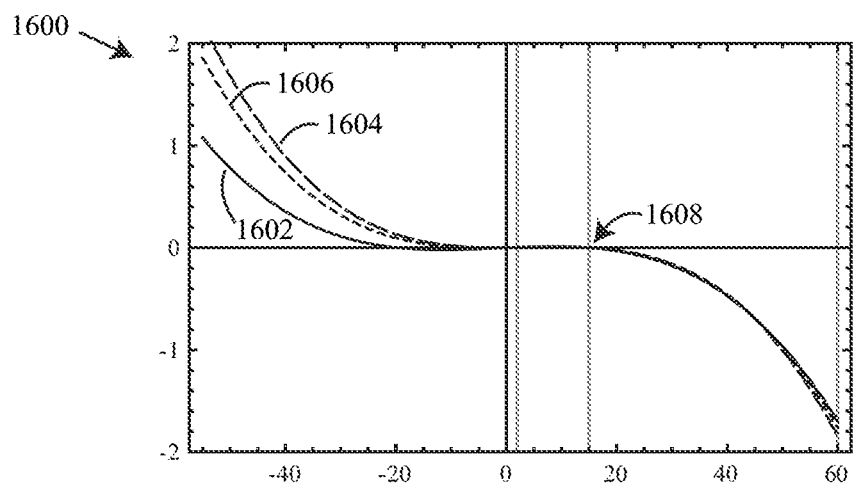
FIG. 16A illustrates the relative frequency error residual after a third step of the polynomial temperature calibration scheme with linear re-adjust applied to an oscillator using a Lamb wave resonator on a composite silicon dioxide and silicon stack.
Figure 16B:
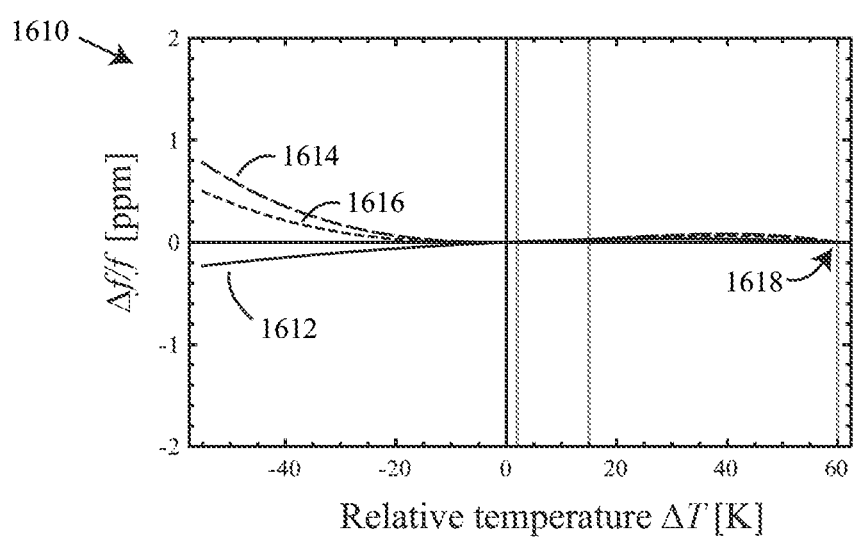
FIG. 16B illustrates the relative frequency error residual after a fourth step of the polynomial temperature calibration scheme with linear re-adjust applied to an oscillator using a Lamb wave resonator on a composite silicon dioxide and silicon stack.

The modified sequence (modified compared to FIG. 9) uses an adjustment step at a first temperature to null the temperature sensor, as previously described (e.g., by adjusting the circuit temperature until the temperature sensor output is nulled). The next adjustment step at the second temperature is used to compensate the linear contribution as before, leading to the result shown in plot 1500 of FIG. 15A, which is identical to the frequency response shown in FIG. 14A (i.e., 1502 is identical to 1402 and 1504 is identical to 1404, although it should be noted that FIGS. 14A and 15A differ in that the graphs illustrate not only the frequency response but also the temperatures (shown in the vertical gray lines) at which the calibration steps are performed, and FIG. 15A shows a temperature at 15 Kelvin whereas FIG. 14A shows the corresponding temperature line at between 55 and 60 Kelvin). At the third temperature the second order contribution is adjusted and the result is shown in plot 1510 of FIG. 15B, which illustrates an identical frequency response to that of FIG. 14B (i.e., 1512 is identical to 1412, 1514 is identical to 1414, 1516 is identical to 1416, and 1518 is identical to 1418), although again the figures differ in that the illustrated test temperatures (shown by the vertical gray lines) differ. According to the modified sequence, at the fourth temperature, which is chosen to lie in between the second and third temperatures, the linear term controlled by 1024 is re-adjusted. In other words, after initially adjusting the DAC 1024 to compensate for the linear contribution earlier in the calibration process, that compensation may be negatively impacted by the subsequent compensation of the second order error. Thus, after the compensation at the second and third temperatures is performed, the process may involve re-adjusting the DAC 1024 to ensure that the linear term is compensated by readjusting the DAC value until the oscillator frequency at the fourth temperature matches the desired frequency. This readjustment at the fourth temperature results in the traces 1602, 1604 and 1606 in plot 1600 of FIG. 16A, where 1608 represent the working point at the fourth temperature. Compensation of the third order contribution may then be performed using a fifth temperature, which can be chosen to be identical with the third temperature, resulting in the behavior illustrated in plot 1610 of FIG. 16B. Trace 1614 corresponds to 1604 of FIG. 16A after using the fifth temperature 1618. Likewise, traces 1612 and 1616 correspond to traces 1602 and 1606, respectively, after compensation at the fifth temperature. By adjusting the value of the DAC 1032 at the fifth temperature to meet the desired frequency the third order contribution may be removed. As a result, the residual frequency error after passing this calibration sequence is about ±1 ppm, and even smaller in the temperature range spanned by the smallest and largest temperature used during the calibration (see FIG. 16B). To reduce the residual error even more, negative temperatures can be used during the calibration.

Several features of the temperature compensation circuit block diagram 1000 shown in FIG. 10 are worth noting. The first is that a first temperature step is required to null the temperature sensor reading. As a result, adjustment of the circuit at four to five temperatures is necessary to obtain a third order compensation of the circuit. Secondly, adjusting the circuit components as described at any given temperature affects not only the frequency response at that temperature but also at other temperatures, including previously tested temperatures. This effect becomes more severe if non-ideal behavior of the circuit components is included, such that the frequency measurement may be limited to an accuracy of, e.g., 0.1 ppm.

Figure 17:
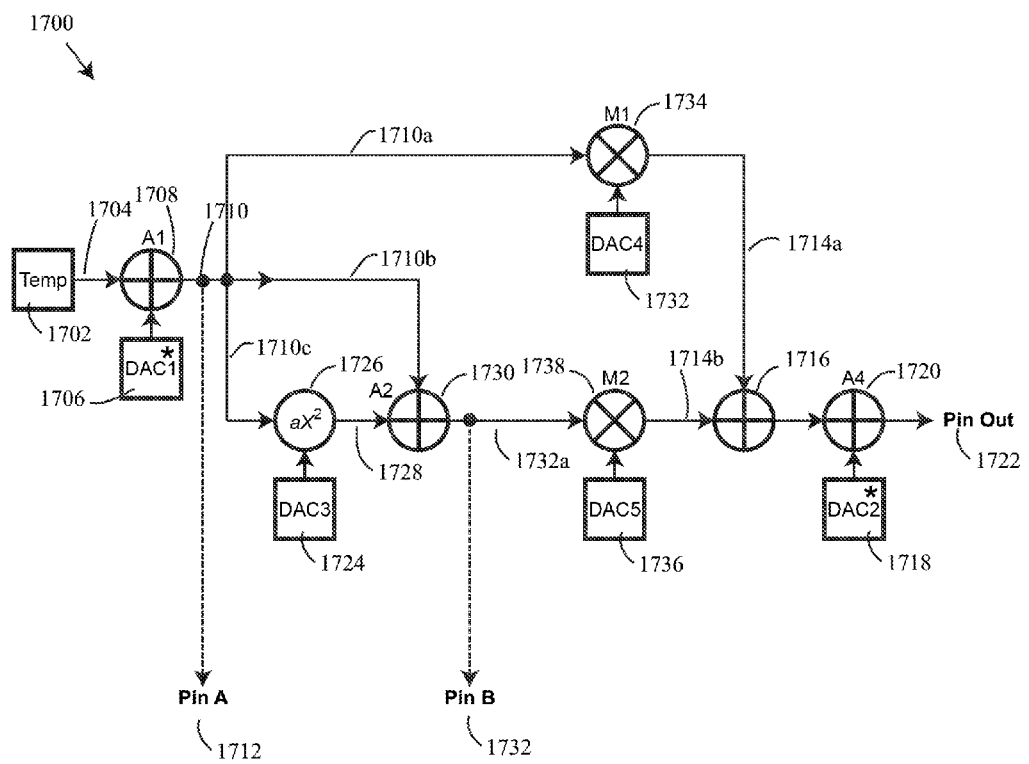
FIG. 17 is a block diagram of a temperature compensation circuit according to one embodiment.

The circuit block diagram 1700 shown in FIG. 17 addresses the characteristics of circuit 1000 just described since they may be undesirable in some situations.

The circuit 1700 includes a temperature sensor 1702 producing a temperature sensor signal 1704, which is provided to adder A1 1708. DAC*1 1706 also provides its output signal to adder 1708. The adder 1708 outputs signal 1710, which may be measured at Pin A 1712. The output signal 1710 is branched into signals 1710a, 1710b, and 1710c, which are provided to mixer M1 1734, adder A2 1730, and quadratic component 1726, respectively. DAC 3 1724 also provides its output to the quadratic component 1726, which produces signal 1728. Adder A2 1730 produces an output signal 1732a which may be measured at Pin B 1732 and which is provided to mixer M2 1738. DAC 5 1736 also provides its output signal to mixer 1738, the output 1714b of which is provided to adder 1716. Adder 1716 also receives an output signal 1714a of mixer M1 1734. As mentioned, mixer 1734 receives 1710a as one input and also receives the output of DAC4 1732 as a second input. Adder 1716 is coupled to adder A4 1720 to provide its output signal to adder 1720. DAC*2 1718 also provides it output to adder 1720, which then provides output 1722 of the circuit.

The circuit 1700 does not require a distinct calibration of the temperature sensor signal 1704 from temperature sensor 1702, and the frequency error at a given temperature is not affected by subsequent adjustments. In this case, including the sequence of 950 in method 900 is of interest as it can help during the first actual tuning step to estimate what the overall frequency error over temperature is for a specific oscillator. From knowing the frequency of the oscillator around, e.g., room temperature and at the first measurement temperature Temperature 1 (step 920) the overall temperature characteristic can be estimated. This is understood from examining FIG. 13B around room temperature and the frequency deviation for a 60K higher temperature. Even if the temperature accuracy of the initial frequency measurement in step 908 is large, as large as ±5° C., ±10° C. or even larger, the temperature characteristics can be estimated. From this estimate, the required tuning range can be determined and used to define the desired frequency of the oscillator. In general, tuning an oscillator will cause the phase noise of the oscillator to increase, which is undesirable. From being able to estimate the required tuning range, the desired frequency can be chosen to fulfill various possible requirements of interest. For example, if an optimum of the phase noise is desired around a specific temperature, the desired frequency can be chosen to coincide with the frequency the oscillator would have at this temperature with a tuning signal of zero. In another case, better phase noise performance may be desired for positive temperatures than at negative temperatures, which may be achieved by choosing the desired frequency to coincide with the frequency of the oscillator with the tuning signal being zero for a temperature larger than the center of the temperature range.

Figure 18A:
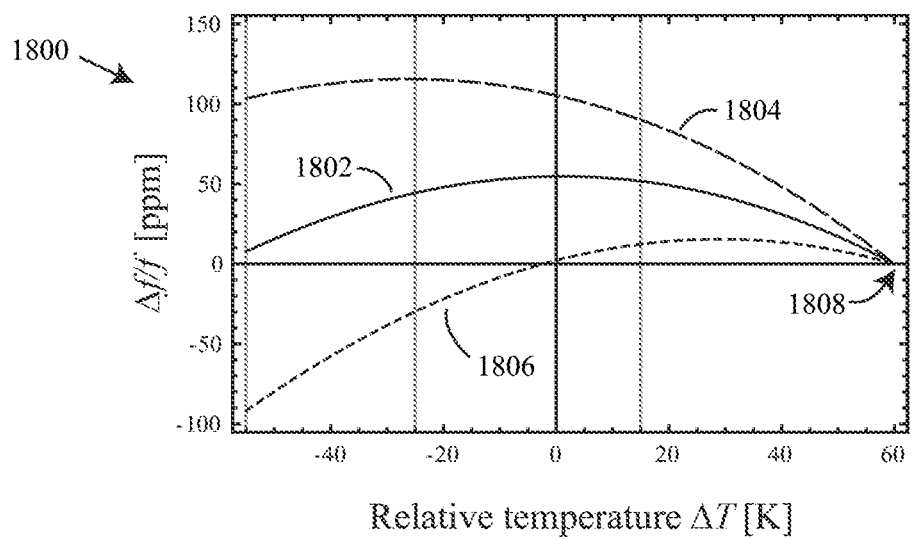
FIG. 18A illustrates the relative frequency error residual after a first step of the temperature calibration scheme of FIG. 9 applied to an oscillator using a Lamb wave resonator on a composite silicon dioxide and silicon stack.

That means after initially measuring the frequency at Temperature 0, generally close to room temperature (25° C.) in step 908 and storing the frequency, the oscillator is exposed to a first well controlled temperature as part of step 920. There is an advantage of choosing this first temperature at one of the extremes of the temperature range. A positive temperature is generally more desirable. At this first well controlled temperature of step 920 the temperature signal 1710 (output by adder 1708) is adjusted to zero by controlling DAC 1706 to cancel the temperature sensor signal 1704, which is done by measuring the electrical signal at Pin A 1712. As a result of 1710 being zero the tuning signal 1722 depends on the value stored in DAC 1718. The oscillator frequency is measured and adjusted to match the desired frequency by adjusting the value stored in 1718. The resulting temperature characteristics are shown in plot 1800 of FIG. 18A, which correspond to the results of FIG. 13B simply shifted to be zero at the point indicated by 1808 (i.e., 1802 is a shifted version of 1302, 1804 is a shifted version of 1354, and 1806 is a shifted version of 1356).

Figure 18B:
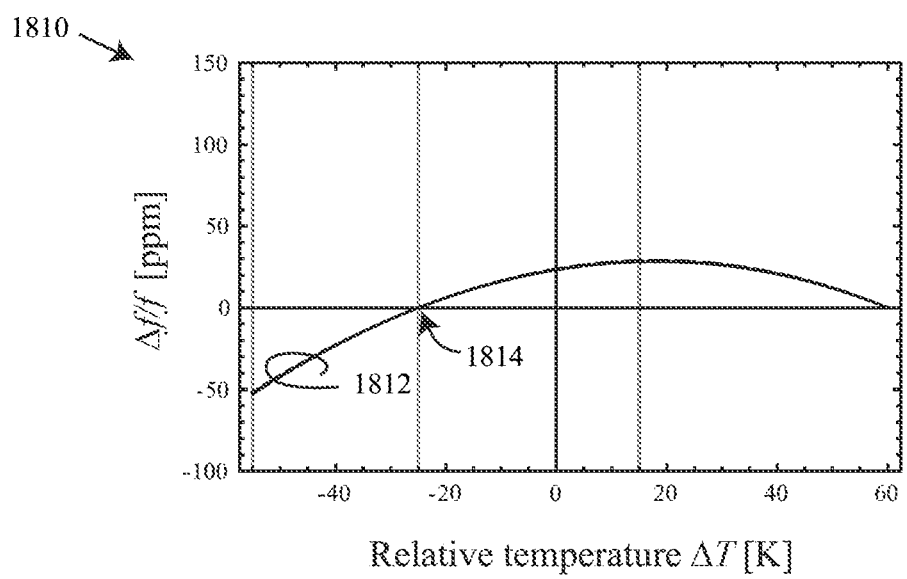
FIG. 18B illustrates the relative frequency error residual after a second step of the temperature calibration scheme of FIG. 9 has been applied to an oscillator using a Lamb wave resonator on a composite silicon dioxide and silicon stack.

The oscillator is then exposed to the second temperature and the frequency measured in step 930. This temperature is chosen closer to the most negative extreme of the temperature range. In some cases it might be desirable to use a temperature around 0° C. or +5° C., or above −20° C. to avoid technical difficulties of the temperature control and icing related reliability issues. The circuit is then adjusted at step 932 by measuring the electrical signal 1732a at Pin B 1732 and adjusting DAC 1724 until the electrical signal 1732a is zero. Then DAC4 1732 is adjusted until the oscillator frequency matches the desired frequency. The resulting frequency error over temperature is shown in plot 1810 of FIG. 18B, in which 1812 represents the frequency error and 1814 represents the working point of the second temperature.

As the third temperature measurement 940 a temperature in between the first and second temperatures is chosen. The value of DAC 1736 is adjusted until the oscillator frequency matches the desired frequency. The resulting frequency error is shown in plot 1820 of FIG. 18C, with traces 1822, 1824, and 1826. Point 1828 represents the working point at the third temperature. It should be appreciated that for all traces 1822, 1824 and 1826 the frequency error at the three measurement temperatures is zero. The residual frequency error is mostly below ±0.5 ppm, however it exceeds this range for the negative temperature range. By choosing the second temperature to be more negative this frequency error for negative temperatures can be improved.

Figure 19:
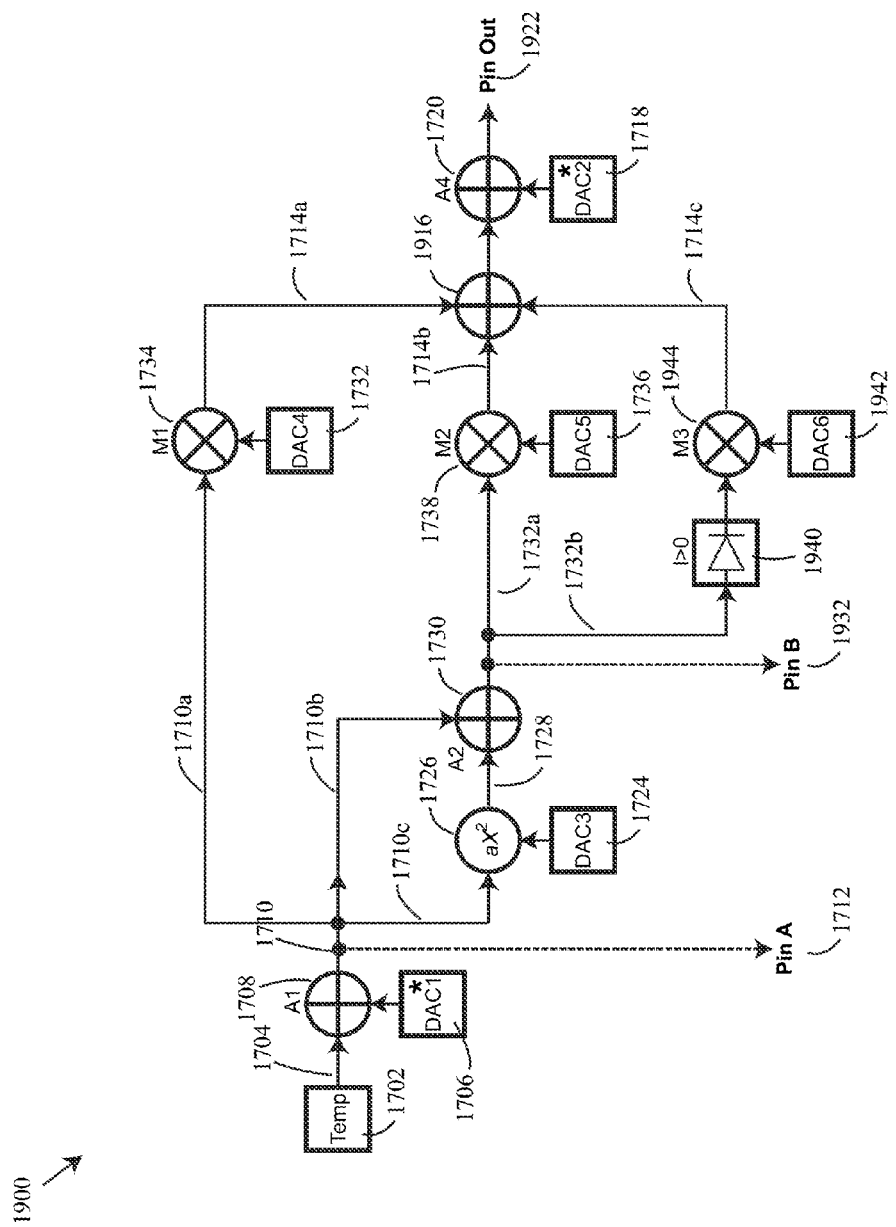
FIG. 19 is a block diagram of a temperature compensation circuit with additional sub-zero correction compared to the embodiment of FIG. 17, according to another embodiment.

A slight modification of the block diagram of circuit 1700 is shown in FIG. 19 as circuit 1900. Those elements that are the same are labeled with the same reference numbers and so are not described in detail again here. Circuit 1900 includes additional components such as diode 1940, DAC6 1942, and mixer M3 1944. The signal 1732a output by adder A2 1730 (which may be measured with Pin B 1932) is branched to signal 1732b and provided to the diode 1940. The diode 1940 compares the value of signal 1732b to zero and passes the signal only if it is greater than zero. Any suitable circuit component for performing such a function may be used, as a diode is a non-limiting example. The output of diode 1940 is input to mixer M3 1944, which also receives an output of DAC6 1942. Mixer 1944 then output signal 1714c to adder 1916. Adder 1916 is similar to adder 1716 of FIG. 17, except that it receives the additional input 1714c where adder 1716 does not. The output of adder 1916 is provided to adder A4 1720, as is the output of DAC*2 1718. Adder 1720 then provides the output signal 1922 of the circuit.

Circuit 1900 contains the element DAC6 1942 that can be adjusted either at a fourth temperature by matching the oscillator frequency to the desired frequency or 1942 might be set to a value based on the values used for 1724 and DAC4 1732. In this case the non-linearity of the digital to analog converter can have an effect on the accuracy of the tuning signal.

Figure 18C:
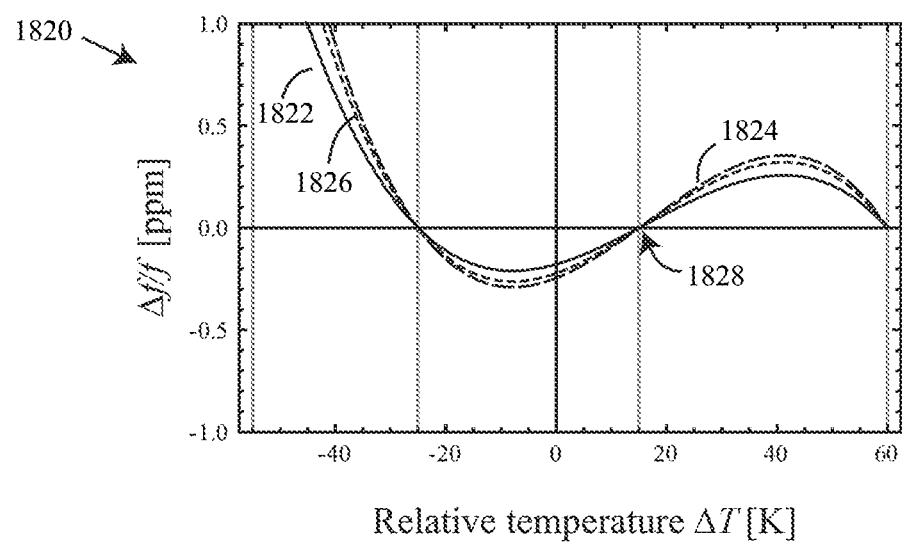
FIG. 18C illustrates the relative frequency error residual after a third step of the temperature calibration scheme of FIG. 9 has been applied to an oscillator using a Lamb wave resonator on a composite silicon dioxide and silicon stack.
Figure 20:
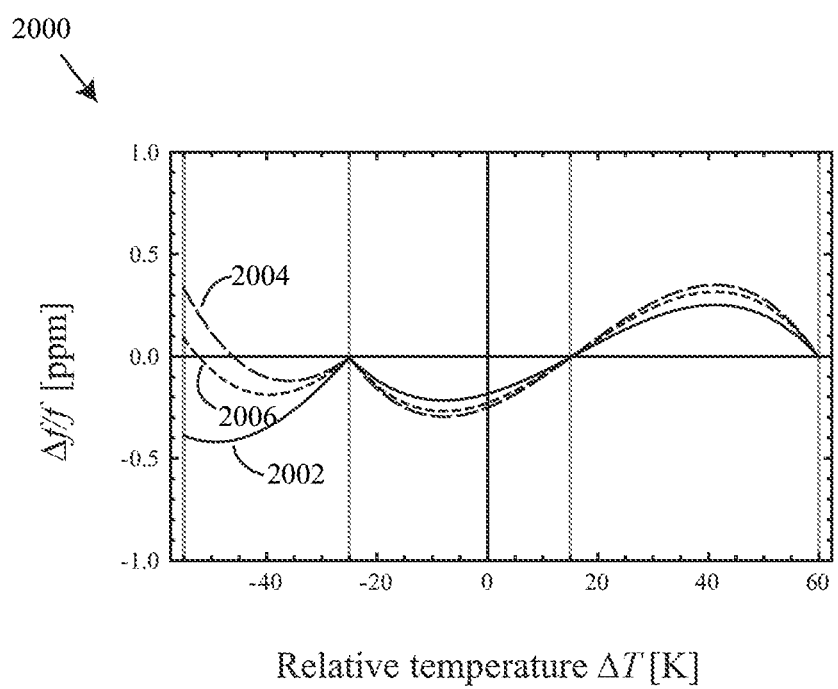
FIG. 20 illustrates the relative frequency error residual after a fourth step of the temperature calibration scheme of FIG. 9 with additional sub-zero correction applied to an oscillator using a Lamb wave resonator on a composite silicon dioxide and silicon stack, according to another embodiment.

Using circuit 1900, the result shown in FIG. 18C is improved for negative temperatures, as shown in plot 2000 of FIG. 20. In plot 2000, trace 2002 corresponds to trace 1822 of FIG. 18C improved for negative temperature, trace 2004 corresponds to trace 1824 improved for negative temperatures, and trace 2006 corresponds to trace 1826 improved for negative temperatures. In this case the adjustment was done based on the values used for 1724 and DAC4 1732.

While various embodiments described herein have been described as using at least three temperatures (e.g., the method of FIG. 9), not all embodiments are limited in this respect. According to at least one embodiment, as few as two temperatures may be used while still providing accurate temperature calibration and compensation. As few as two temperatures may be used in situations in which, for example, only the linear error is compensated during the calibration process by measuring frequency response at different temperatures. In such situations, temperature measurements and circuit adjustments may be performed at two temperatures (e.g., Temperatures 1 and 2 in FIG. 9) as previously described to compensate the linear error. Further temperature measurements may not be needed to compensate the second order error because, for example, the second order error may be known or substantially known beforehand (for example, in situations in which the second order error does not vary significantly from resonator to resonator and is therefore known from measurements performed on previous resonators). The third order error may simply not be compensated in some situations if not desired. Thus, accurate temperature compensation may be provided using as few as two temperature points.

One or more benefits compared to conventional calibration and temperature compensation technology may be realized by utilizing the aspects described herein. For example, the time involved in calibrating temperature compensation circuitry may be reduced, and in some instances significantly reduced, by utilizing one or more of the aspects described. As a non-limiting example, compared to measuring the frequency response of an oscillator at over 1,200 temperatures, as conventionally done, much less time may be involved in using the methods described herein in which significantly fewer temperatures are analyzed (e.g., ten temperatures or less). Moreover, while conventional calibration techniques require a second temperature sweep over the entire operating temperature range, at least some of the aspects described herein may negate the need for any such confirmation temperature sweep, thus saving further time and effort. Furthermore, compared to storing calibration values for a large number of temperatures (e.g., 1,200), as conventionally done, significantly less or no storage may be needed according to at least some of the aspects described herein. Additionally, as described previously, at least some of the aspects described herein allow for temperature calibration to be performed without precise temperatures, thus easing constraints on the process. In other words, the calibration may be performed irrespective of whether the test temperature is, for example, 33C or 35C. Using stable test temperatures may be sufficient (e.g., a test temperature that remains at 33C during the testing at that temperature).

It should be appreciated that various aspects are described herein. According to one aspect, circuits and methods for calibrating temperature compensation circuitry of an oscillator by measuring the frequency of the oscillator at distinct and well controlled temperatures and adjusting a circuit until the oscillator frequency matches the desired frequency are provided. In some such situations, the calibration may be performed without measuring the oscillator behavior over an entire operating temperature range and without computing best adjustment settings for multiple components of a temperature compensation circuit. Thus, aspects of the present invention may be simpler and more robust than conventional techniques for calibration of temperature compensation circuitry.

According to some non-limiting embodiments of the above-described aspect, the frequency error for the temperatures used to adjust the calibration circuit may be minimal and may not be affected by any subsequent calibration step. Thus, the adjustment of individual components of a temperature compensation circuit may be independent of the adjustment of other components of the circuit.

According to another aspect, a calibration method of an oscillator is provided for calibrating the oscillator frequency behavior over a temperature range (e.g., an operating temperature range). The calibration may method may be designed to avoid any final temperature sweep conventionally required to ensure accuracy of the calibration. In some non-limiting embodiments, the calibration method also, or alternatively, does not require a full sweep over the entire temperature operating range before adjusting the temperature compensation circuit. According to some non-limiting embodiments, the calibration method involves making circuit adjustments at each of multiple temperature steps of the calibration method, rather than measuring the oscillator frequency at many temperatures and then making one adjustment. In some non-limiting embodiments, the calibration method may use temperatures that are precise (stable) (i.e. temperature stability of e.g. ±2K, ±0.5K, ±0.1K) but not necessarily accurate (i.e., that do not necessarily equal a specifically targeted temperature value).

According to one aspect, temperature compensation circuitry is provided including one or more digital-to-analog converters (DACs). Calibration of the temperature compensation circuitry may comprise adjusting the DACs by programming them. In some non-limiting embodiments, the DACs are non-linear, though in some embodiments linear DACs may be used. The temperature calibration may be performed without evaluating the DAC digital-to-analog conversion relation prior to setting the DAC. The calibration may involve adjusting each DAC until the oscillator frequency matches a desired frequency.

According to another aspect, compensation of arbitrary frequency oscillators may be accomplished using one or more of the techniques described herein. However, it should be appreciated that the techniques may be applied to various types of oscillators, and arbitrary frequency oscillators represent a non-limiting example.

According to another aspect, temperature calibration techniques described herein may utilize various temperatures for the calibration. Various scenarios are possible, some non-limiting examples of which are now described.

According to some embodiments, it may be desirable to apply one or more of the techniques described herein to resonators whose temperature dependent frequency shows a strong cubic characteristic, such as AT-cut quartz crystals. According to some such embodiments, it may be desirable to null the temperature sensor as described above around the center of the operating temperature range within 20% tolerance of the absolute range of the temperature range at a first temperature. To address a linear coefficient of the temperature dependent frequency behavior, a temperature between 34° C. and 39° C. may be implemented as a second temperature. To address a quadratic component of the temperature dependent frequency behavior, a temperature between 11° C. and 39° C. (e.g., between 35° C. and 39° C.) may be used as a third temperature. To address a cubic component of the temperature dependent frequency behavior, a temperature between 39° C. to 85° C. or lower than 11° C. (e.g., between 11° C. and −40° C.) may be used as a fourth temperature. These are non-limiting examples.

According to some embodiments, it may be desirable to apply one or more of the techniques described herein to resonators whose temperature dependent frequency shows a strong quadratic characteristic, such as BT-cut crystals, MEMS resonators, and temperature compensated FBARs. According to some such embodiments, it may be desirable to null the temperature sensor as described above around the center of the operating temperature range within 20% tolerance of the absolute range of the temperature range at a first temperature. To address a linear coefficient of the temperature dependent frequency behavior, a temperature close to the center of the operating temperature range may be chosen as the second temperature, e.g., within the range including the center of the temperature range ±20% of the absolute range of the temperature range. To address a quadratic component of the temperature dependent frequency behavior, a temperature close to the extremes of the temperature range may be selected as a third temperature, e.g., within 30% tolerance of the absolute range of the temperature range. To perform a linear re-adjustment step on such types of resonators (i.e., using a fourth temperature), the fourth temperature may be chosen in the center of the third temperature and second temperature within 20% tolerance of the absolute temperature range. Alternatively, the fourth temperature may be located within ±25% from the extreme temperature with a 40% tolerance of the absolute temperature range. To address a cubic component of the temperature dependent frequency behavior, a temperature close to the extremes of the temperature range may be selected as a fifth calibration temperature, e.g., within 40% of the absolute range of the temperature range. These are non-limiting examples.

According to some embodiments, it may be desirable to apply one or more of the techniques described herein to oscillators where the lowest temperature used during calibration is limited. For example, according to one embodiment, the techniques described herein may be applied to calibration of an oscillator when the lowest temperature range of calibration is not lower than the center of the specified operating range of the oscillator. In some embodiments, the calibration may be applied when the lowest temperature of the calibration is 10% of the total operating temperature range lower than the center temperature of the operating range. In some embodiments, the calibration may be applied when the lowest temperature of the calibration is 20% of the total operating temperature range lower than the center temperature of the operating range. In some embodiments, the calibration may be applied when the lowest temperature of the calibration is 30% of the total operating range lower than the center temperature of the operating range. Alternatives are possible.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

The invention claimed is:

1. A method of calibrating temperature compensation circuitry of an oscillator, the oscillator comprising a mechanical resonator coupled to the temperature compensation circuitry, the method comprising:
   setting a first temperature of the oscillator;
   adjusting a first component of the temperature compensation circuitry to set an output frequency of the oscillator to a desired value at the first temperature;
   setting a second temperature of the oscillator; and
   adjusting a second component of the temperature compensation circuitry to set the output frequency of the oscillator to the desired value at the second temperature,
   wherein the first component and the second component are digital-to-analog converters (DACs), and wherein adjusting those components comprises programming values into those components, and
   wherein the DACs are not linear DACS.

2. The method of claim 1, wherein the method of calibrating the temperature compensation circuitry does not involve performing a temperature sweep with the oscillator.

3. The method of claim 1, wherein the first and second temperatures are stable but not accurate.

4. A method of calibrating temperature compensation circuitry of an oscillator, the oscillator comprising a mechanical resonator coupled to the temperature compensation circuitry, the method comprising:
   setting a first temperature of the oscillator;
   adjusting a first component of the temperature compensation circuitry to set an output frequency of the oscillator to a desired value at the first temperature;
   setting a second temperature of the oscillator; and
   adjusting a second component of the temperature compensation circuitry to set the output frequency of the oscillator to the desired value at the second temperature,
   further comprising setting a third temperature of the oscillator and adjusting a third component of the temperature compensation circuitry to set the output frequency of the oscillator to the desired value at the third temperature,
   wherein each of the first, second, and third components is a digital-to-analog converter (DAC) configured to independently adjust the output frequency of the oscillator independent of the other two of the DACs.

5. A temperature compensation circuit configured to form part of an oscillator comprising a mechanical resonator, the temperature compensation circuit comprising:
   at least first and second adjustable circuit components configured to independently alter an output frequency of the oscillator,
   wherein the at least first and second adjustable circuit components comprise a first adjustable circuit component, a second adjustable circuit component, and a third adjustable circuit component, and
   wherein the first adjustable circuit component is configured to control a linear component of a temperature-dependent frequency response of the oscillator,
   wherein the second adjustable circuit component is configured to control a quadratic component of the temperature-dependent frequency response of the oscillator, and
   wherein the third adjustable circuit component is configured to control a cubic component of the temperature-dependent frequency response of the oscillator,
   further comprising a plurality of adders coupled to the first, second, and third adjustable circuit components,
   wherein each of the first, second, and third adjustable circuit components is a digital-to-analog converter (DAC), and wherein the temperature compensation circuit further comprises a fourth DAC coupled to at least one first adder of the plurality of adders and a fifth DAC coupled to at least one second adder of the plurality of adders.

6. The temperature compensation circuit of claim 5, wherein one adder of the plurality of adders receives an input from a temperature sensor.

* * * * *